(12) United States Patent
Jagannathan et al.

(10) Patent No.: US 9,006,094 B2
(45) Date of Patent: Apr. 14, 2015

(54) STRATIFIED GATE DIELECTRIC STACK FOR GATE DIELECTRIC LEAKAGE REDUCTION

(75) Inventors: Hemanth Jagannathan, Guilderland, NY (US); Paul C. Jamison, Hopewell Junction, NY (US)

(73) Assignee: International Business Machines Corporation, Armonk, NY (US)

( * ) Notice: Subject to any disclaimer, the term of this patent is extended or adjusted under 35 U.S.C. 154(b) by 58 days.

(21) Appl. No.: 13/449,647

(22) Filed: Apr. 18, 2012

(65) Prior Publication Data

US 2013/0280902 A1 Oct. 24, 2013

(51) Int. Cl.
  *H01L 21/20* (2006.01)
  *H01L 29/49* (2006.01)
  *H01L 29/51* (2006.01)
  *H01L 29/66* (2006.01)
  *H01L 29/78* (2006.01)
  *H01L 21/28* (2006.01)

(52) U.S. Cl.
  CPC ....... *H01L 29/4958* (2013.01); *H01L 21/28211* (2013.01); *H01L 29/513* (2013.01); *H01L 29/518* (2013.01); *H01L 29/66545* (2013.01); *H01L 29/6659* (2013.01); *H01L 29/7833* (2013.01)

(58) Field of Classification Search
  USPC .................. 438/595, 199, 291; 257/410, 411, 257/E29.126
  See application file for complete search history.

(56) References Cited

U.S. PATENT DOCUMENTS

| | | | |
|---|---|---|---|
| 6,787,424 B1 | 9/2004 | Yu | |
| 6,936,901 B2 | 8/2005 | Yamamoto | |
| 7,659,157 B2 | 2/2010 | Greene et al. | |
| 2002/0117725 A1 | 8/2002 | Oowaki et al. | |
| 2002/0130340 A1* | 9/2002 | Ma et al. | 257/295 |
| 2005/0040481 A1* | 2/2005 | Shimizu et al. | 257/411 |
| 2005/0051854 A1* | 3/2005 | Cabral et al. | 257/407 |
| 2005/0151184 A1 | 7/2005 | Lee et al. | |
| 2005/0269651 A1 | 12/2005 | Chen et al. | |

(Continued)

OTHER PUBLICATIONS

Office Action, dated Jun. 3, 2013, received in a related U.S. Patent Application, namely U.S. Appl. No. 13/467,186.

(Continued)

*Primary Examiner* — Matthew Gordon
(74) *Attorney, Agent, or Firm* — Scully, Scott, Murphy & Presser, P.C.; Daniel P. Morris, Esq.

(57) ABSTRACT

A stratified gate dielectric stack includes a first high dielectric constant (high-k) gate dielectric comprising a first high-k dielectric material, a band-gap-disrupting dielectric comprising a dielectric material having a different band gap than the first high-k dielectric material, and a second high-k gate dielectric comprising a second high-k dielectric material. The band-gap-disrupting dielectric includes at least one contiguous atomic layer of the dielectric material. Thus, the stratified gate dielectric stack includes a first atomic interface between the first high-k gate dielectric and the band-gap-disrupting dielectric, and a second atomic interface between the second high-k gate dielectric and the band-gap-disrupting dielectric that is spaced from the first atomic interface by at least one continuous atomic layer of the dielectric material of the band-gap-disrupting dielectric. The insertion of the band-gap disrupting dielectric results in lower gate leakage without resulting in any substantial changes in the threshold voltage characteristics and effective oxide thickness.

15 Claims, 22 Drawing Sheets

(56) References Cited

U.S. PATENT DOCUMENTS

| | | |
|---|---|---|
| 2006/0084232 A1 | 4/2006 | Grupp et al. |
| 2006/0289948 A1 | 12/2006 | Brown et al. |
| 2007/0152271 A1 | 7/2007 | Dewey et al. |
| 2009/0078997 A1 | 3/2009 | Greene et al. |
| 2009/0294800 A1 | 12/2009 | Cheng et al. |
| 2011/0143529 A1 | 6/2011 | Lee et al. |
| 2011/0210405 A1 | 9/2011 | Nakagawa et al. |

OTHER PUBLICATIONS

Office Action dated Nov. 25, 2013 received in a related U.S. Patent Application, namely U.S. Appl. No. 13/467,186.

* cited by examiner

STRATIFIED GATE DIELECTRIC STACK FOR GATE DIELECTRIC LEAKAGE REDUCTION

BACKGROUND

The present disclosure generally relates to semiconductor devices, and particularly to a semiconductor structure having a gate dielectric comprising a stratified gate dielectric stack comprising two atomic interfaces that provide discontinuities in the band gap structure of the gate dielectric, and methods of manufacturing the same.

One of the main challenges in advanced high-performance field effect transistors is the high gate leakage current through a high-k gate dielectric between the gate electrode and the body of a field effect transistor. The high-k gate dielectric consisting of a single homogeneous dielectric material requires to be continually reduced in thickness to obtain higher performance of the field effect transistor but at the expense of increased gate leakage.

Addition of a capping layer over a high-k dielectric has been known to result in simultaneous modulation of the work function of the gate stack. In prior art gate stacks including a capping layer, the material of the capping layer inter-diffuses into an underlying high-k gate dielectric and an interfacial layer there below. Further, the material of the capping layer also diffuse into a work function metal in the gate electrode.

BRIEF SUMMARY

The gate leakage can be reduced without impact to the effective work function of the gate stack by employing a dielectric material layer that disrupts the band gap of a high-k gate dielectric, providing benefits to field effect transistors of all polarities on a semiconductor substrate. The dielectric material layer that disrupts the band gap structure of a gate dielectric material can be inserted in the middle of the gate dielectric material to form a gate dielectric composed of a stratified gate dielectric stack. The stratified gate dielectric stack includes a first high dielectric constant (high-k) gate dielectric comprising a first high-k dielectric material, a band-gap-disrupting dielectric comprising a dielectric material having a different band gap than the first high-k dielectric material, and a second high-k gate dielectric comprising a second high-k dielectric material. The second high-k dielectric material can be the same as, or different from, the first high-k dielectric material. The band-gap-disrupting dielectric includes at least one contiguous atomic layer of the dielectric material. Thus, the stratified gate dielectric stack includes a first atomic interface between the first high-k gate dielectric and the band-gap-disrupting dielectric, and a second atomic interface between the second high-k gate dielectric and the band-gap-disrupting dielectric that is spaced from the first atomic interface by at least one continuous atomic layer of the dielectric material of the band-gap-disrupting dielectric.

According to an aspect of the present disclosure, a method of forming a semiconductor structure including a field effect transistor (FET) is provided. The method includes: forming a first high dielectric constant (high-k) gate dielectric layer including a first high-k dielectric material and located on a semiconductor substrate; forming a band-gap-disrupting dielectric layer including a dielectric material having a different band gap than the first high-k gate dielectric on the first high-k gate dielectric layer; forming a second high-k gate dielectric layer including a second high-k dielectric material having a different band gap than the band-gap-disrupting dielectric of the band-gap-disrupting dielectric layer; and patterning a stack of the first high-k gate dielectric layer, the band-gap-disrupting dielectric layer, and the second high-k gate dielectric layer to form a stratified gate dielectric stack of a first high-k gate dielectric, a band-gap-disrupting dielectric, and a second high-k gate dielectric, wherein a first atomic interface between the band-gap-disrupting dielectric and the first high-k gate dielectric is spaced from a second atomic interface between the band-gap-disrupting dielectric and the second high-k gate dielectric by at least one continuous atomic layer of the dielectric material of the band-gap-disrupting dielectric within the stratified gate dielectric stack.

According to another aspect of the present disclosure, a semiconductor structure including a field effect transistor that includes a stratified gate dielectric stack is provided. The stratified gate dielectric stack includes: a first high dielectric constant (high-k) gate dielectric including a first high-k dielectric material and located on a semiconductor substrate; a band-gap-disrupting dielectric including a dielectric material having a different band gap than the first high-k gate dielectric; and a second high-k gate dielectric including a second high-k dielectric material having a different band gap than the band-gap-disrupting dielectric, wherein a first atomic interface between the band-gap-disrupting dielectric and the first high-k gate dielectric is spaced from a second atomic interface between the band-gap-disrupting dielectric and the second high-k gate dielectric by at least one continuous atomic layer of the dielectric material of the band-gap-disrupting dielectric.

DETAILED DESCRIPTION

Figure 1:
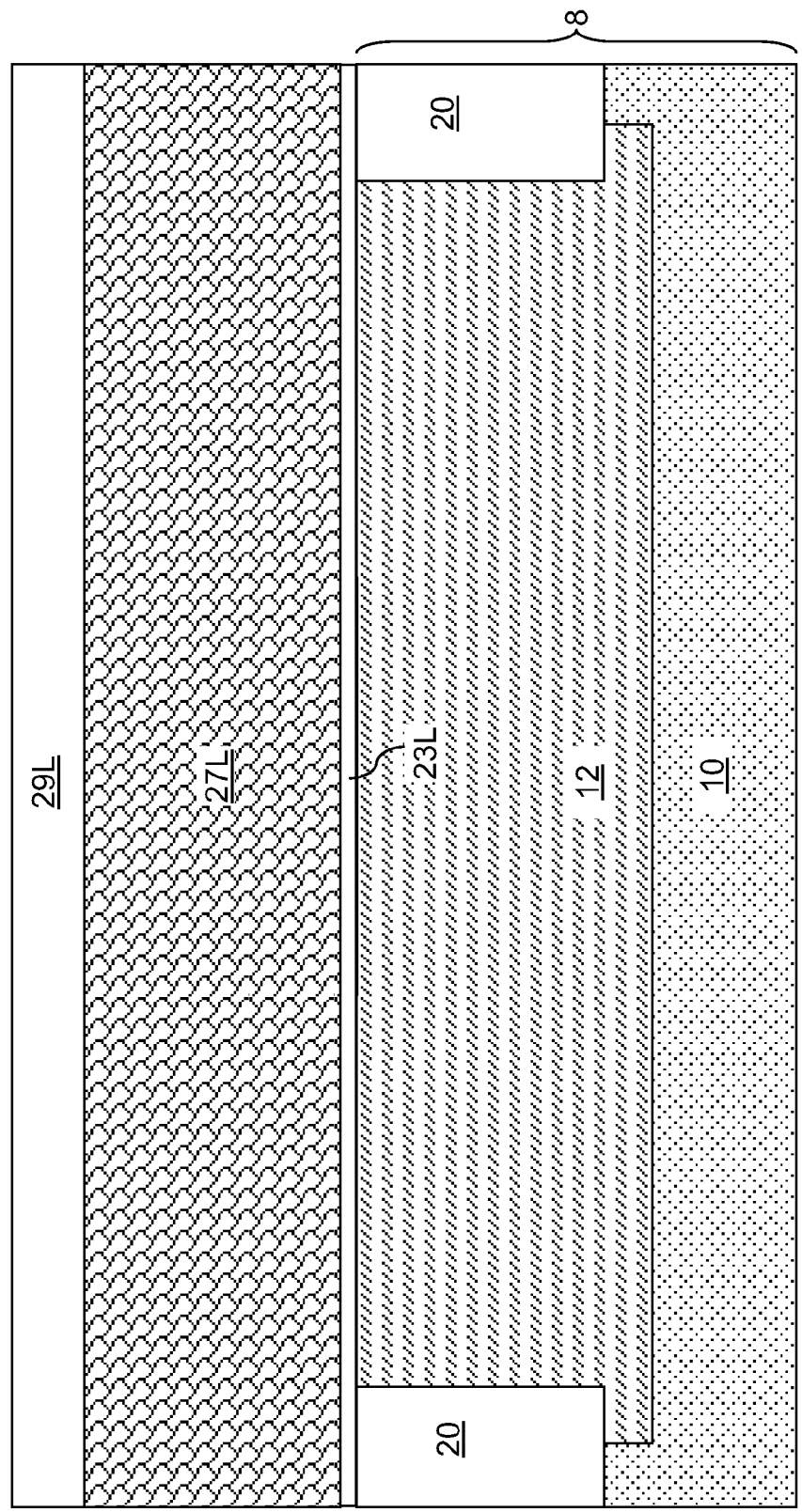
FIG. 1 is vertical cross-sectional view of a first exemplary semiconductor structure after formation of disposable gate level layers according to a first embodiment of the present disclosure.

As stated above, the present disclosure relates to semiconductor devices, and particularly to a semiconductor structure having a stratified gate dielectric stack comprising two atomic interfaces that provide discontinuities in the band gap structure of a gate dielectric, which are now described in detail with accompanying figures. Like and corresponding elements mentioned herein and illustrated in the drawings are referred to by like reference numerals. The drawings are not necessarily drawn to scale.

Referring to FIG. 1, a first exemplary semiconductor structure according to the first embodiment of the present disclosure includes a semiconductor substrate 8, on which various components of field effect transistors are subsequently formed. The semiconductor substrate 8 can be a bulk substrate including a bulk semiconductor material throughout, or a semiconductor-on-insulator (SOI) substrate (not shown) containing a top semiconductor layer, a buried insulator layer located under the top semiconductor layer, and a bottom semiconductor layer located under the buried insulator layer.

Various portions of the semiconductor material in the semiconductor substrate 8 can be doped with electrical dopants of n-type or p-type at different dopant concentration levels. For example, the semiconductor substrate 8 may include an underlying semiconductor layer 10 and an active region 12 having a doping different from the doping of the underlying semiconductor layer 10. The active region 12 can be a doped well. Alternately, the active region 12 can be a portion of a top semiconductor layer of an SOI substrate overlying a buried insulator layer.

Shallow trench isolation structures 20 can be formed to laterally separate the active region 12 from other semiconductor regions (not shown) in which other semiconductor devices are subsequently formed. If the semiconductor substrate 8 is an SOI substrate, the shallow trench isolation structures 20 can extend to the top surface of the buried insulator layer. Topmost surfaces of the shallow trench isolation structures can be substantially coplanar with, raised above, or recessed below, the topmost surface of the active region 12.

Disposable gate level layers are deposited on the semiconductor substrate 8 as blanket layers, i.e., as unpatterned contiguous layers. The disposable gate level layers can include, for example, a vertical stack a disposable gate dielectric layer 23L, a disposable gate material layer 27L, and a disposable gate cap dielectric layer 29L. The disposable gate dielectric layer 23L can be, for example, a layer of silicon oxide, silicon nitride, or silicon oxynitride. The thickness of the disposable gate dielectric layer 23L can be from 1 nm to 10 nm, although lesser and greater thicknesses can also be employed. The disposable gate material layer 27L includes a material that can be subsequently removed selective to the dielectric material of a planarization dielectric layer to be subsequently formed. For example, the disposable gate material layer 27L can include a semiconductor material such as a polycrystalline semiconductor material or an amorphous semiconductor material. The thickness of the disposable gate material layer 27L can be from 30 nm to 300 nm, although lesser and greater thicknesses can also be employed. The disposable gate cap dielectric layer 29L can include a dielectric material such as silicon oxide, silicon nitride, or silicon oxynitride. The thickness of the disposable gate cap dielectric layer 29L can be from 3 nm to 30 nm, although lesser and greater thicknesses can also be employed. While the present disclosure is illustrated with disposable gate level layers including a vertical stack a disposable gate dielectric layer 23L, a disposable gate material layer 27L, and a disposable gate cap dielectric layer 29L, any other disposable gate level layers can also be employed provided that the material(s) in the disposable gate level layers can be removed selective to a planarization dielectric layer to be subsequently formed.

Figure 2:
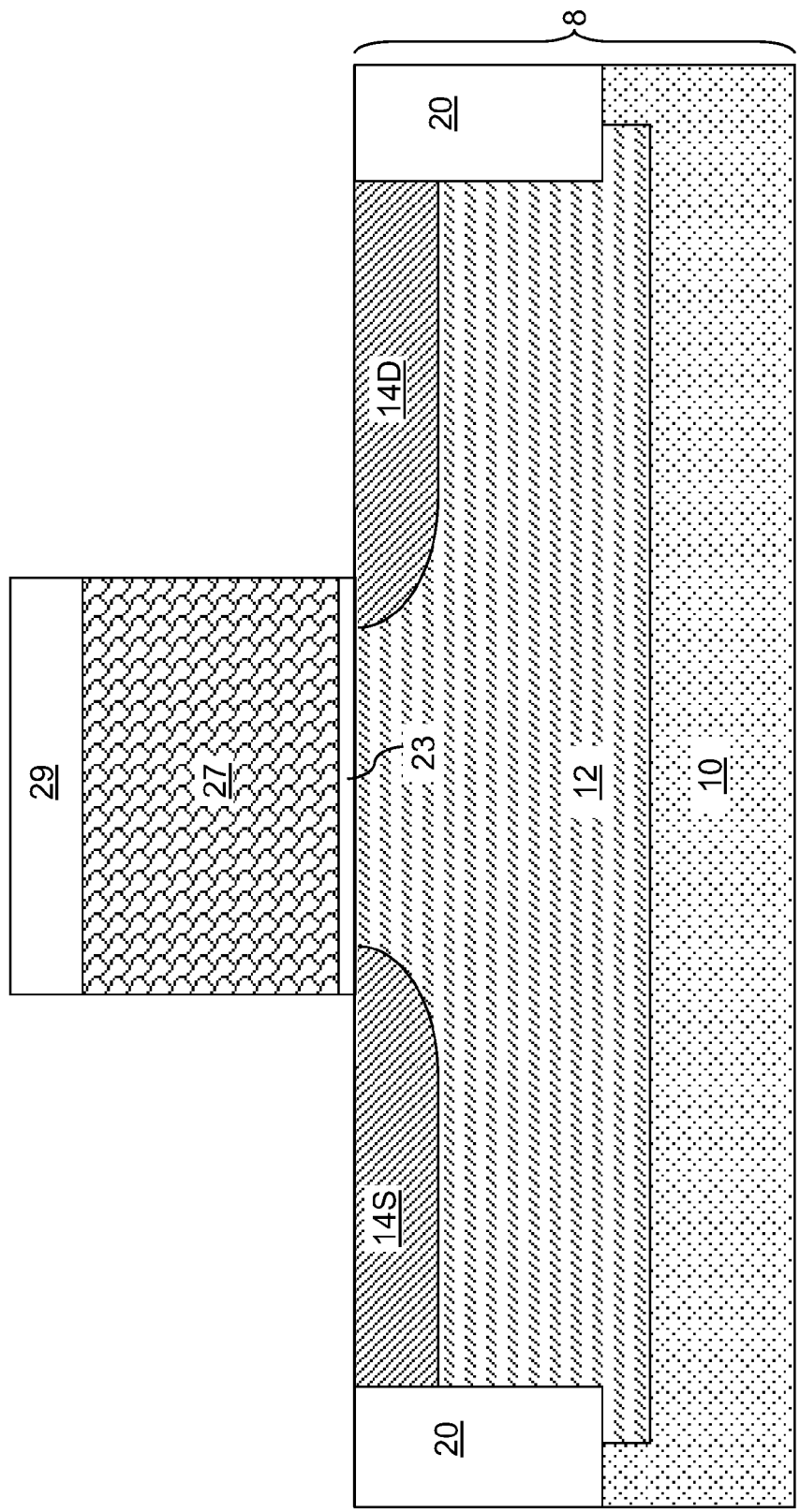
FIG. 2 is a vertical cross-sectional view of the first exemplary semiconductor structure after patterning of disposable gate structures and formation of source/drain extension regions according to the first embodiment of the present disclosure.

Referring to FIG. 2, the disposable gate level layers (29L, 27L, 23L) are lithographically patterned to form a disposable gate structure. Specifically, a photoresist (not shown) is applied over the topmost surface of the disposable gate level layers (29L, 27L, 23L) and is lithographically patterned by lithographic exposure and development. The pattern in the photoresist is transferred into the disposable gate level layers (29L, 27L, 23L) by an etch, which can be an anisotropic etch such as a reactive ion etch. The remaining portions of the disposable gate level layers (29L, 27L, 23L) after the pattern transfer constitute a disposable gate structure having vertically coincident sidewalls.

The disposable gate structure is a stack of a disposable gate dielectric portion 23, a disposable gate material portion 27, and a disposable gate cap portion 29. The disposable gate cap portion 29 is a remaining portion of the disposable gate cap dielectric layer 29L. The disposable gate material portion 27 is a remaining portion of the disposable gate material layer 27L. The disposable gate dielectric portion 23 is a remaining portion of the disposable gate dielectric layer 23L.

Ion implantations can be employed to form a source extension region 14S and a drain extension region 14D. The disposable gate structure (23, 27, 29) is employed as a self-aligning implantation mask. Optionally, an implantation mask (not shown) can be employed to block other regions (not shown) in which other semiconductor devices are formed. As used herein, "source/drain extension regions" collectively refer to source extension regions and drain extension regions.

Figure 3:
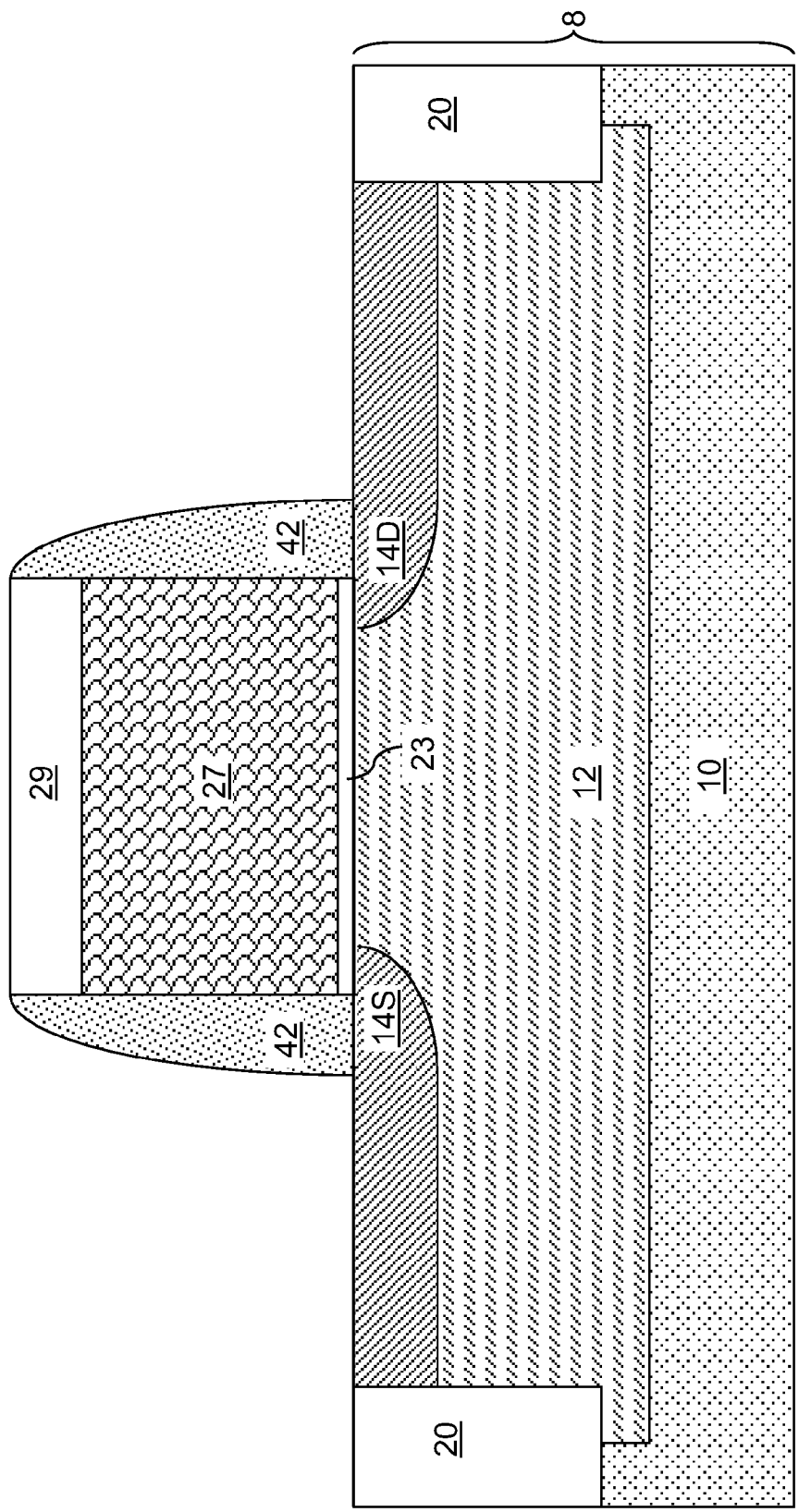
FIG. 3 is a vertical cross-sectional view of the first exemplary semiconductor structure after formation of a gate spacer according to the first embodiment of the present disclosure.

Referring to FIG. 3, a gate spacer 42 is formed on sidewalls of the disposable gate structure (23, 27, 29), for example, by deposition of a conformal dielectric material layer and an anisotropic etch. The gate spacer 42 includes a dielectric material such as silicon oxide, silicon nitride, and silicon oxynitride.

Figure 4:
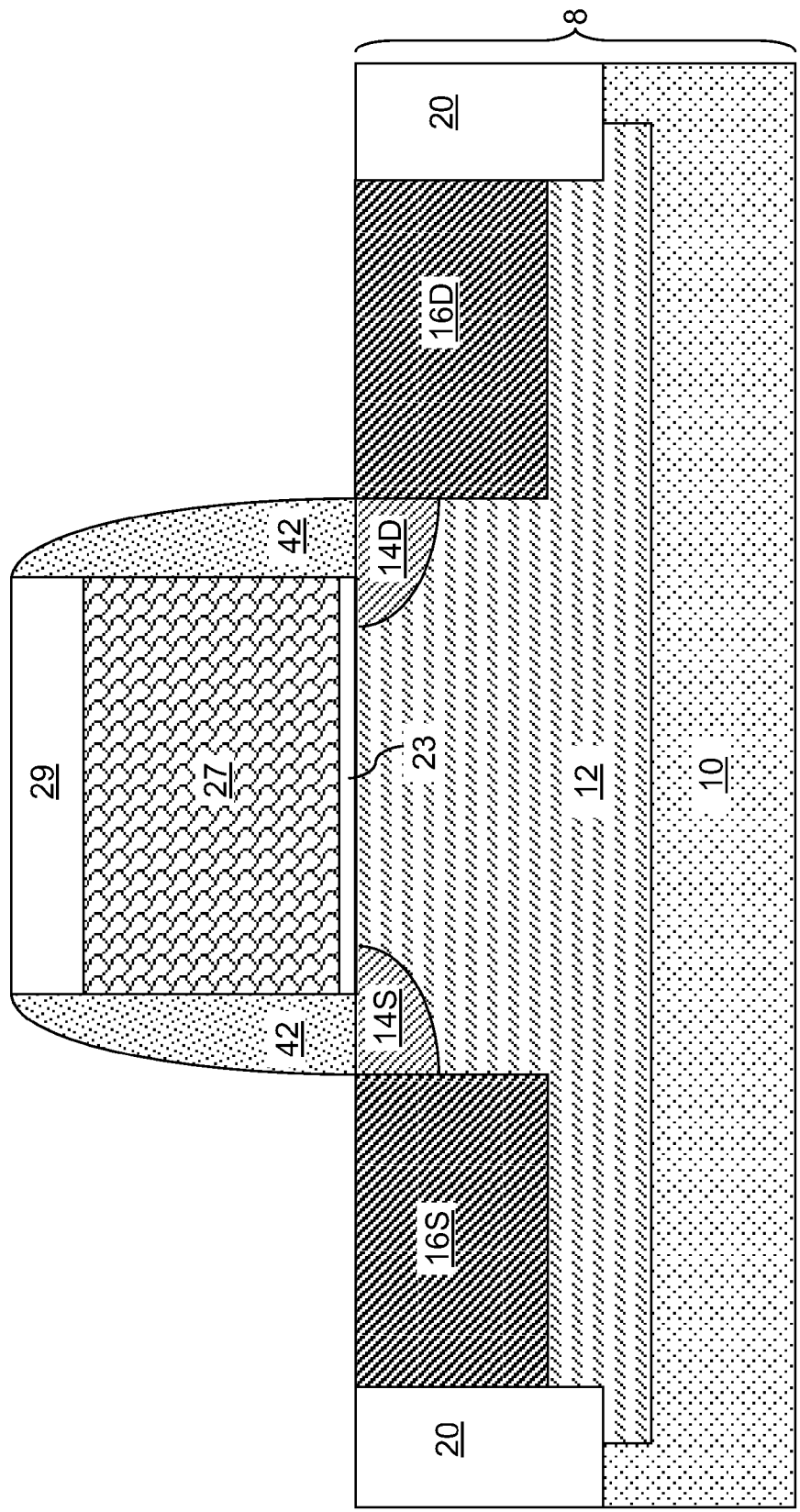
FIG. 4 is a vertical cross-sectional view of the first exemplary semiconductor structure after formation of source and drain regions and source and drain metal semiconductor alloy portions according to the first embodiment of the present disclosure.

Referring to FIG. 4, dopant ions can be implanted into portions of the active region 12 to form a source region 16S and a drain region 16D employing the disposable gate structure (23, 27, 29) and the gate spacer 42 as an implantation mask. Alternately, portions of the active region 12 can be removed from regions between the outer sidewalls of the gate spacer 42 and the shallow trench isolation structures 20 and substituted with a stress-generating doped semiconductor material to form the source region 16S and the drain region 16D. For example, if the active region 12 includes silicon, the stress-generating doped semiconductor material can be a doped silicon-carbon alloy or a doped silicon-germanium alloy.

Figure 5:
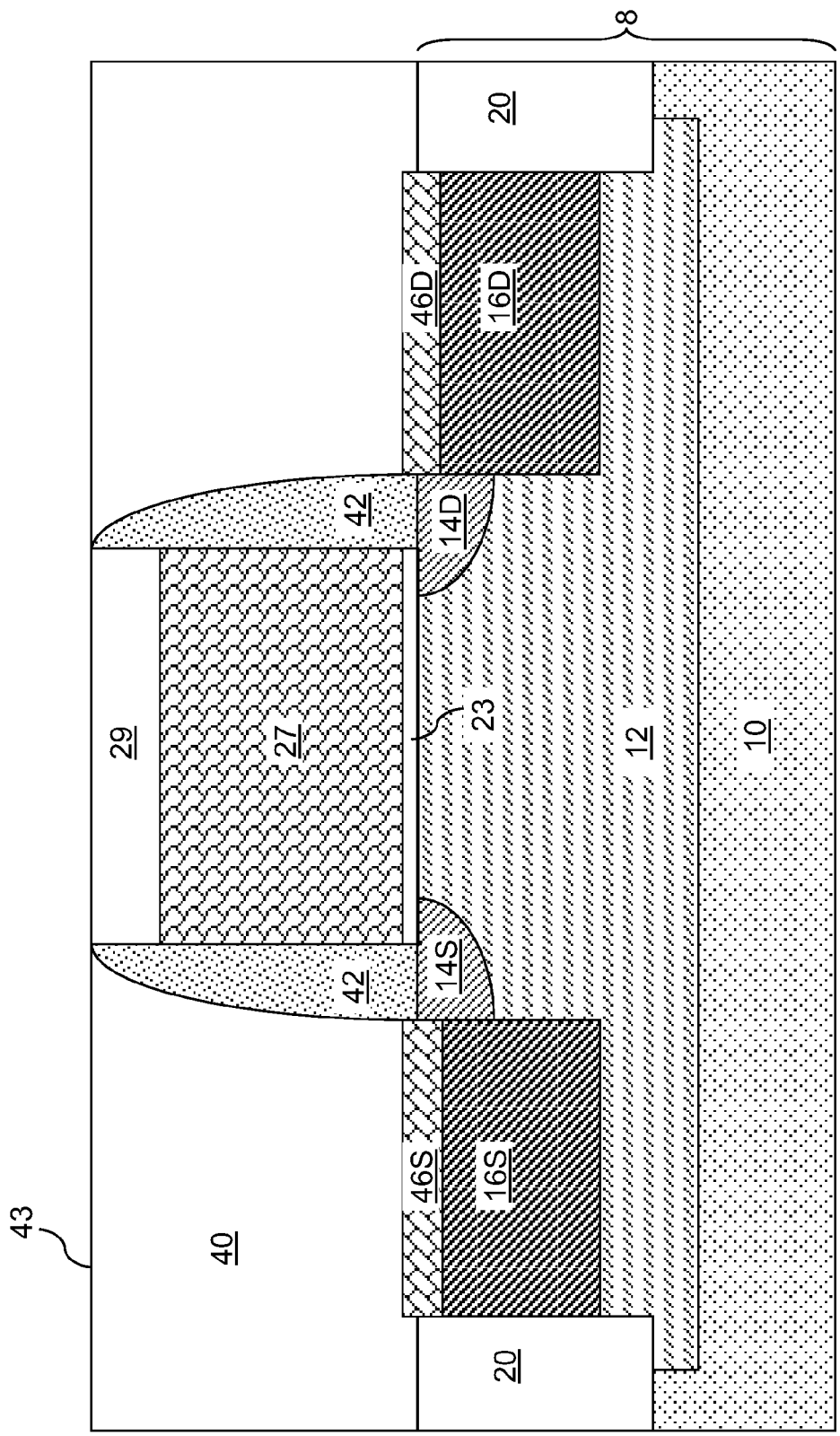
FIG. 5 is a vertical cross-sectional view of the first exemplary semiconductor structure after deposition and planarization of a planarization dielectric layer according to the first embodiment of the present disclosure.

Referring to FIG. 5, a source-side metal semiconductor alloy portion 46S and drain-side metal semiconductor alloy portion 46D can be optionally formed on physically exposed semiconductor surfaces of the source region 16S and the drain region 16D, respectively, for example, by deposition of a metal layer (not shown) and an anneal. Unreacted portions of the metal layer are removed selective to reacted portions of the metal layer. The reacted portions of the metal layer constitute the metal semiconductor alloy portions (46S, 46D), which can include a metal silicide portions if the semiconductor material of the source region 16S and the drain region 16D includes silicon. Optionally, at least one stress-generating dielectric liner (not shown) may be deposited over the metal semiconductor alloy portions (46S, 46D), the disposable gate structure (23, 27, 29), and the gate spacer 42.

A planarization dielectric layer 40 is deposited over the disposable gate structure (23, 27, 29), the gate spacer 42, the source and drain regions (16S, 16D), and, if present, the optional metal semiconductor alloy portions (46S, 46D) and/or the optional at least one stress-generating dielectric liner. In one embodiment, the planarization dielectric layer 40 is a dielectric material that may be easily planarized. For example, the planarization dielectric layer 40 can be a doped silicate glass or an undoped silicate glass (silicon oxide).

The planarization dielectric layer 40 and any underlying stress-generating dielectric liner, if present, are removed from above the topmost surface of the disposable gate structure (23, 27, 29), i.e., above the topmost surfaces of the disposable gate cap portion 29 by planarization. The planarization can be performed, for example, by chemical mechanical planarization (CMP). The planar topmost surface of the planarization dielectric layer 40 is herein referred to as a planar dielectric surface 43. The topmost surface of the disposable gate cap portion 29 can be coplanar with the planar dielectric surface 43 after the planarization.

Figure 6:
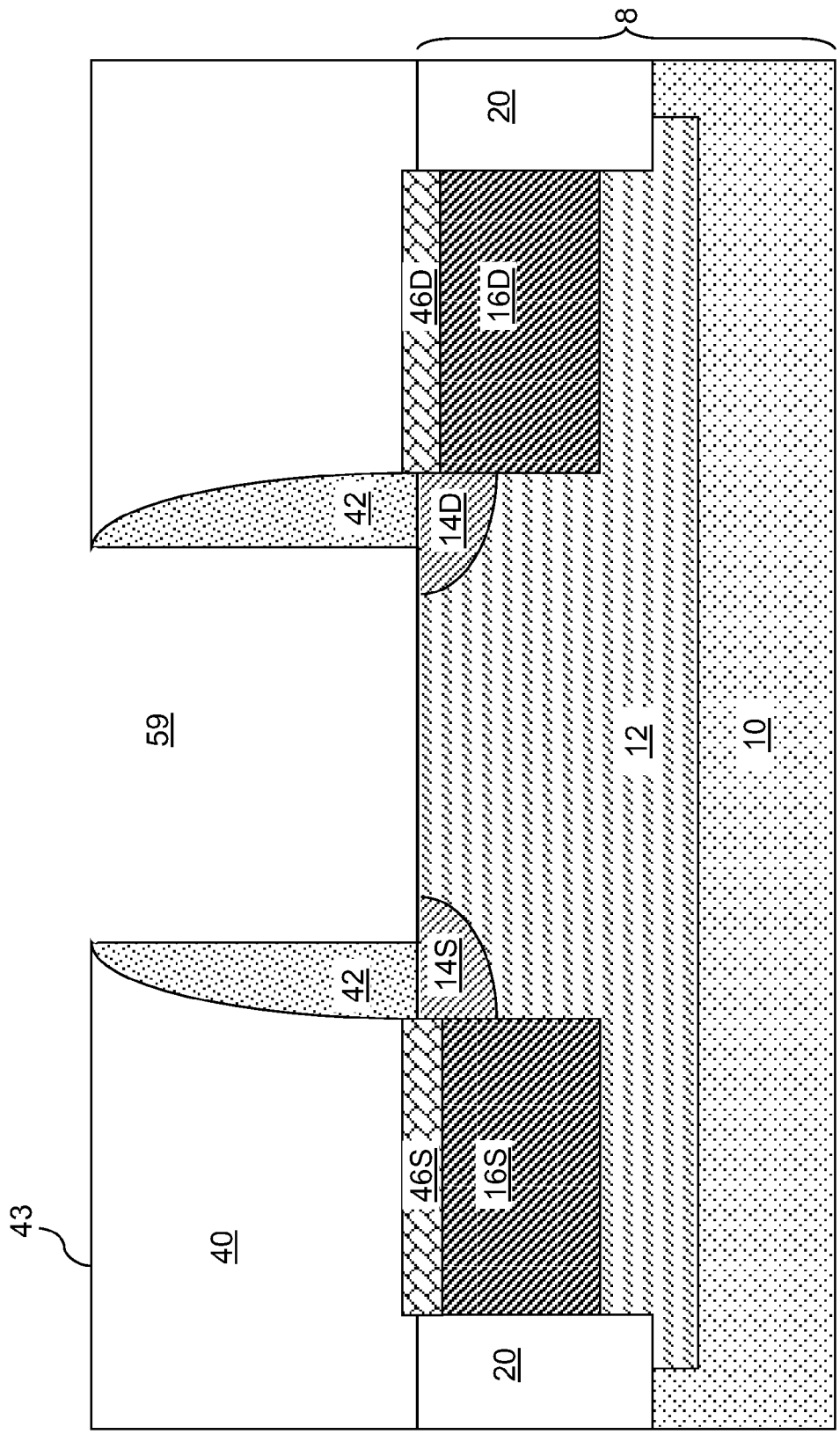
FIG. 6 is a vertical cross-sectional view of the first exemplary semiconductor structure after removal of the disposable gate structures according to the first embodiment of the present disclosure.

Referring to FIG. 6, the disposable gate structure (23, 27, 29) is removed by at least one etch. The disposable gate structure (23, 27, 29) can be removed, for example, by at least one etch, which can include an anisotropic etch, an isotropic etch, or a combination thereof. The at least one etch can include a dry etch and/or a wet etch. The at least one etch employed to remove the disposable gate structure (23, 27, 29) can be selective to the dielectric materials of the planarization dielectric layer 40.

A gate cavity 59 is formed in the volume from which the disposable gate structure (23, 27, 29) is removed. A semiconductor surface of the semiconductor substrate 8, i.e., the top surface of the active region 12, is exposed at the bottom of the gate cavity 59. The gate cavity 59 is laterally surrounded by the planarization dielectric layer 40, i.e., the gate spacer 42 laterally surrounds the gate cavity 59. The inner sidewalls of the gate spacer 42 can be substantially vertical, and extends from the top surface of the active region 12 to the planar dielectric surface 43, i.e., the topmost surface, of the planarization dielectric layer 40.

Figure 7:
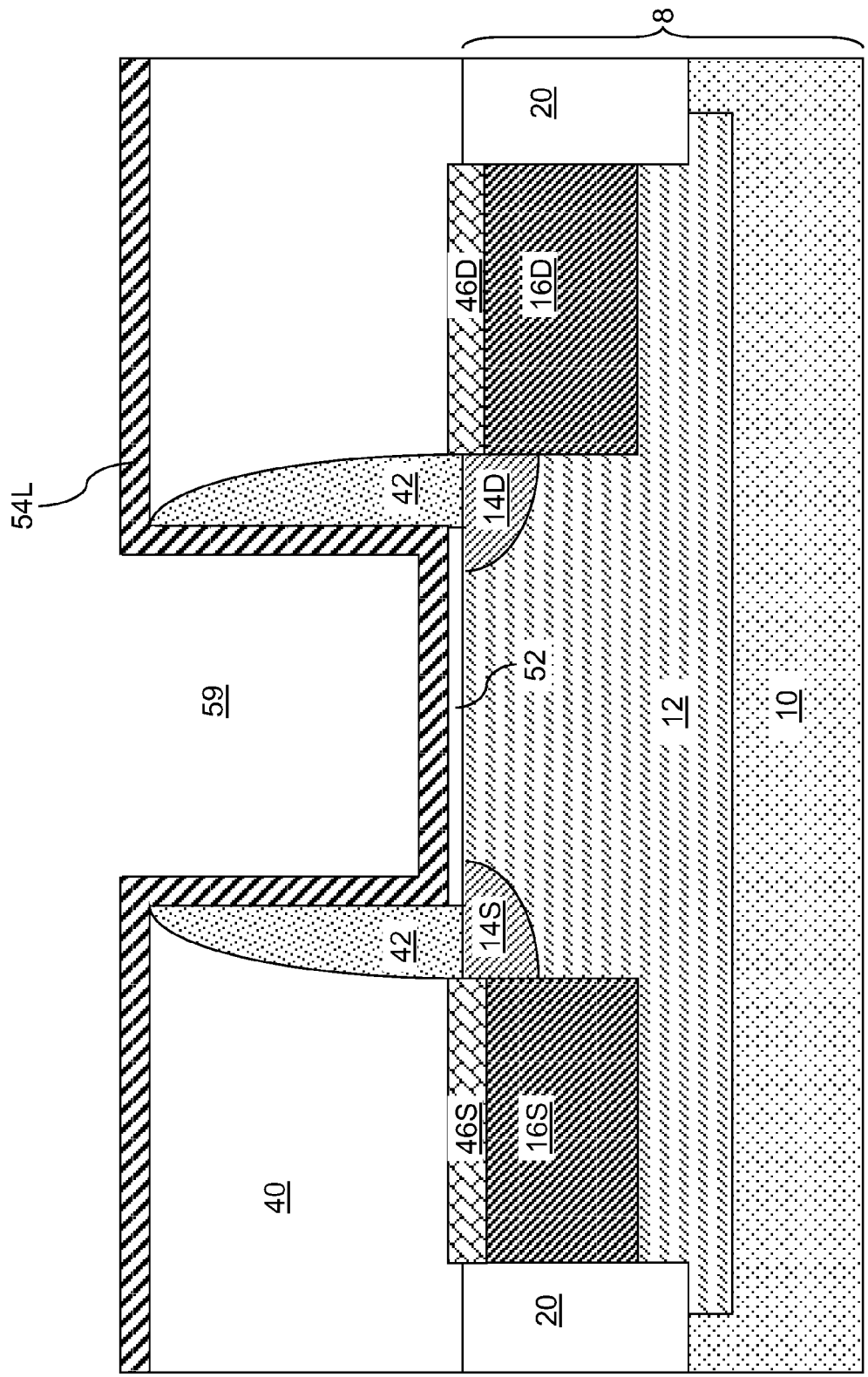
FIG. 7 is a vertical cross-sectional view of the first exemplary semiconductor structure after deposition of a first high dielectric constant (high-k) gate dielectric layer according to the first embodiment of the present disclosure.

Referring to FIG. 7, exposed portions of the semiconductor surfaces of the semiconductor substrate 8 can be converted to a dielectric material layer. For example, an interfacial dielectric 52 can be formed on the exposed surface of the active region 12 by conversion of the exposed semiconductor material into a dielectric material. The interfacial dielectric 52 can be formed by converting a surface portion of a semiconductor material of the semiconductor substrate 8, i.e., a surface portion of the active region 12, into a dielectric material including the semiconductor material and at least one of oxygen and nitrogen. The interfacial dielectric 52 is a semiconductor-element-containing dielectric material, and formation of the interfacial dielectric 52 can be effected by thermal conversion or plasma treatment. If the semiconductor material of the active region 12 includes silicon, the interfacial dielectric 52 can include silicon oxide or silicon nitride. The interfacial dielectric 52 contacts a semiconductor surface underneath and a gate dielectric layer to be subsequently deposited thereupon. The thickness of the interfacial dielectric 52 can be from 0.3 nm to 2 nm, although lesser and greater thicknesses can also be employed.

A first high dielectric constant (high-k) gate dielectric layer 54L including a first high-k dielectric material is deposited on the semiconductor substrate 8. The first high-k gate dielectric layer 54L is deposited directly on the top surface of the interfacial dielectric 52, vertical inner sidewalls of the gate spacer 42, and the planar dielectric surface 43 (See FIG. 6) of the planarization dielectric layer 40. Thus, the first high-k gate dielectric layer 54L is deposited within the gate cavity 59 and over the planarization dielectric layer 40. The gate spacer 42 contacts outer sidewalls of the first high-k gate dielectric layer 54L.

The first high-k gate dielectric layer 54L can include a dielectric metal oxide, which is a high-k material containing a metal and oxygen, and is known in the art as high-k gate dielectric materials. The first high-k dielectric material can be deposited by methods well known in the art including, for example, chemical vapor deposition (CVD), physical vapor deposition (PVD), molecular beam deposition (MBD), pulsed laser deposition (PLD), liquid source misted chemical deposition (LSMCD), atomic layer deposition (ALD), etc. Exemplary materials that can be employed for the first high-k dielectric material include $HfO_2$, $ZrO_2$, $HfO_xN_y$, $ZrO_xN_y$, and alloys thereof, wherein each value of x is independently from 0.5 to 3 and each value of y is independently from 0 to 2. The first high-k gate dielectric layer 54L can be formed as a contiguous layer, i.e., a layer without having a hole therein at atomic level. In one embodiment, the first high-k gate dielectric layer 54L can be formed as a substantially conformal layer. The thickness of the first high-k gate dielectric layer 54L, as measured at horizontal portions, can be from 0.3 nm to 3 nm although lesser and greater thicknesses can also be employed. In one embodiment, the thickness of the first high-k gate dielectric layer 54L can be from 0.4 nm to 1 nm. The first high-k gate dielectric layer 54L may have an effective oxide thickness on the order of or less than 0.5 nm. In one embodiment, the first high-k gate dielectric layer 54L is a hafnium oxide ($HfO_2$) layer.

In one embodiment, the first high-k dielectric material is not a dielectric material that causes undesired threshold voltage shifts or interface dielectric layer thickening upon contact with the interfacial dielectric material layer. Exemplary dielectric materials that could cause such effects in certain scenarios include $La_2O_3$, $Al_2O_3$, $TiO_2$ and combinations thereof.

Figure 8:
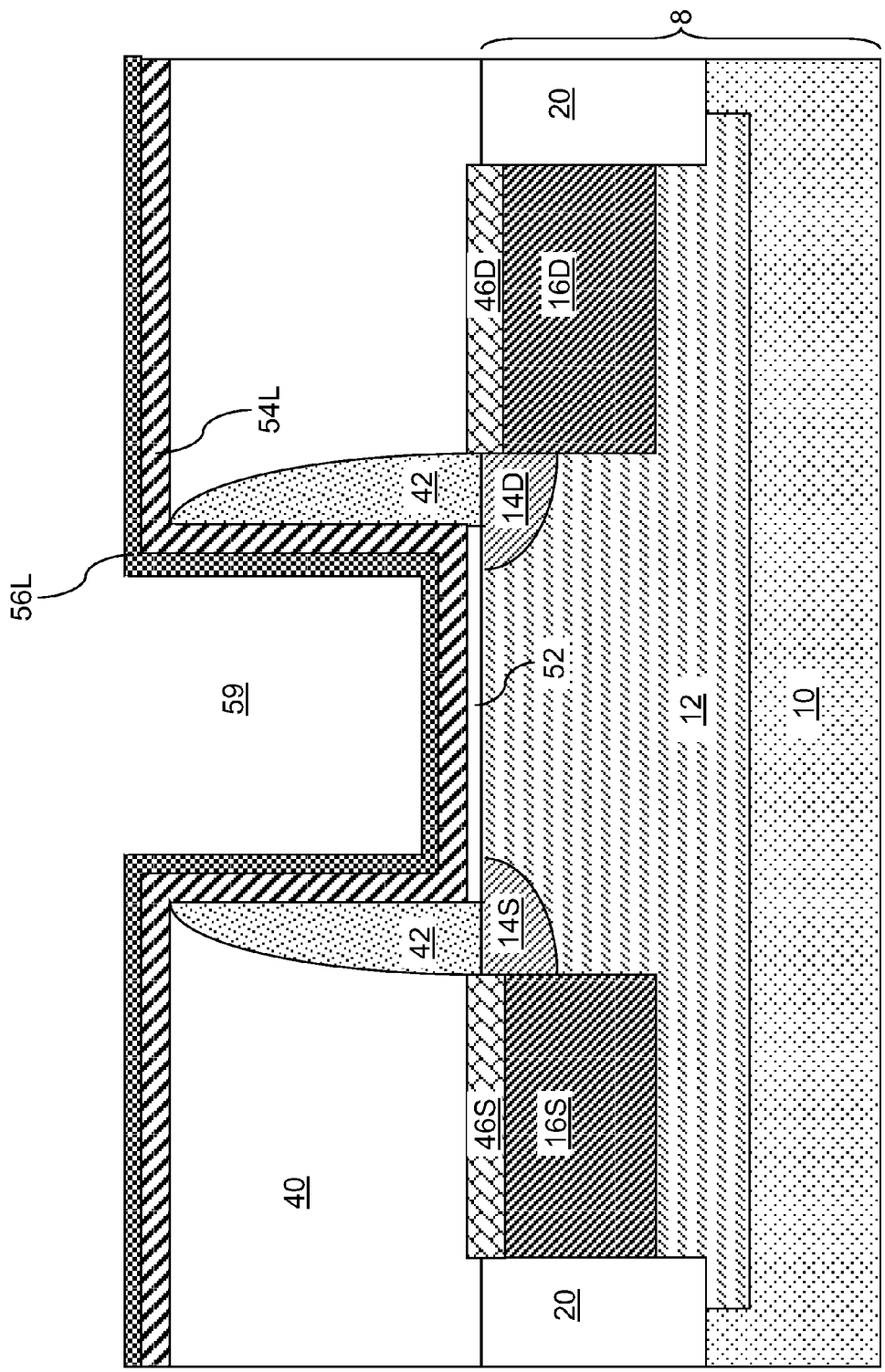
FIG. 8 is a vertical cross-sectional view of the first exemplary semiconductor structure after deposition of a band-gap-disrupting dielectric layer according to the first embodiment of the present disclosure.

Referring to FIG. 8, a band-gap-disrupting dielectric layer 56L including a band-gap-disrupting dielectric material is deposited directly on first high-k gate dielectric layer 54L. As used herein, a band-gap-disrupting dielectric material refers to a dielectric material having a different band gap than the band gap of an underlying dielectric material, e.g., the first high-k dielectric material, thereby disrupting the band gap structure at the interface between the underlying dielectric material and the band-gap-disrupting dielectric material. The band-gap-disrupting dielectric layer 56L is deposited within the gate cavity 59 and over the first high-k gate dielectric layer 54L.

In one embodiment, the band-gap-disrupting dielectric layer 56L can be formed by substantially conformally depositing a dielectric material selected from $La_2O_3$, $Al_2O_3$, $TiO_2$, $La_2O_uN_v$, $Al_2O_uN_v$, $TiO_uN_v$, and an alloy thereof, wherein each value of u is independently from 0.5 to 3 and each value of v is independently from 0 to 2. The dielectric material of the band-gap-disrupting dielectric layer 56L can be deposited employing methods such as chemical vapor deposition (CVD), liquid source misted chemical deposition (LSMCD), atomic layer deposition (ALD), etc. The deposition temperature of the dielectric material of the band-gap-disrupting dielectric layer 56L and post processing temperature is maintained below a temperature above which inter-atomic diffusion occurs at a detectable level so that the inter-diffusion between the material of the first high-k gate dielectric layer 54L and the band-gap-disrupting dielectric layer 56L is suppressed.

In another embodiment, the dielectric material of the band-gap-disrupting dielectric layer 56L can be formed by substantially conformally depositing at least one metal selected from La, Al, and Ti on the physically exposed surfaces of the band-gap-disrupting dielectric layer 56L, and subsequently converting the at least one metal into the dielectric material by oxidation and optional nitridation, which can be effected by exposing the surface of the deposited at least one metal to an oxidizing ambient and optionally in a nitridating ambient at an elevated temperature. The at least one metal can be deposited employing methods such as chemical vapor deposition (CVD), atomic layer deposition (ALD), physical vapor deposition (PVD), etc. The deposition temperature of the at least one metal and the oxidation and/or nitridation temperature along with the post processing temperatures are maintained below 700 degrees Celsius so that the inter-diffusion between the material of the first high-k gate dielectric layer 54L and the band-gap-disrupting dielectric layer 56L is suppressed.

Thus, the band-gap-disrupting dielectric layer 56L can be formed by a substantially conformal deposition method that forms the band-gap-disrupting dielectric layer as a single contiguous layer. The band-gap-disrupting dielectric layer 56L includes at least one atomic layer of the dielectric material. In one embodiment, the thickness of the band-gap-disrupting dielectric layer 56L, as measured at horizontal portions, can be from 0.3 nm to 3 nm. In one embodiment, the thickness of the band-gap-disrupting dielectric layer 56L can be from 0.4 nm to 1 nm. The band-gap-disrupting dielectric layer 56L may have an effective oxide thickness on the order of or less than 0.5 nm. In one embodiment, the dielectric material of the band-gap-disrupting dielectric layer 56L is one of $La_2O_3$, $Al_2O_3$, and $TiO_2$.

The deposition temperature of the dielectric material of the band-gap-disrupting dielectric layer 56L or the at least one metal from which the band-gap-disrupting dielectric layer 56L is maintained below a temperature above which inter-atomic diffusion occurs at a detectable level so that the inter-diffusion between the material of the first high-k gate dielectric layer 54L and the band-gap-disrupting dielectric layer 56L is suppressed. The temperature above which the inter-atomic diffusion occurs across the interface between the first high-k gate dielectric layer 54L and the band-gap-disrupting dielectric layer 56L is less than 800 degrees Celsius, and is typically in a range between 700 degrees Celsius and 800 degrees Celsius. Thus, a first atomic interface is formed between the band-gap-disrupting dielectric layer 56L and the first high-k gate dielectric layer 54L. As used herein, an "atomic interface" is an interface defined at an atomic level between a first continuous atomic layer of a first material and a second continuous atomic layer of a second material. Thus, the first high-k dielectric material of the first high-k gate dielectric layer 54L does not protrude into the band-gap-disrupting dielectric layer 56L across the first atomic interface, and the band-gap-disrupting dielectric material of the band-gap-disrupting dielectric layer 56 does not protrude into the first high-k gate dielectric layer 54L across the first atomic interface. Thus, the first atomic interface is planar at the atomic level.

Figure 8A:
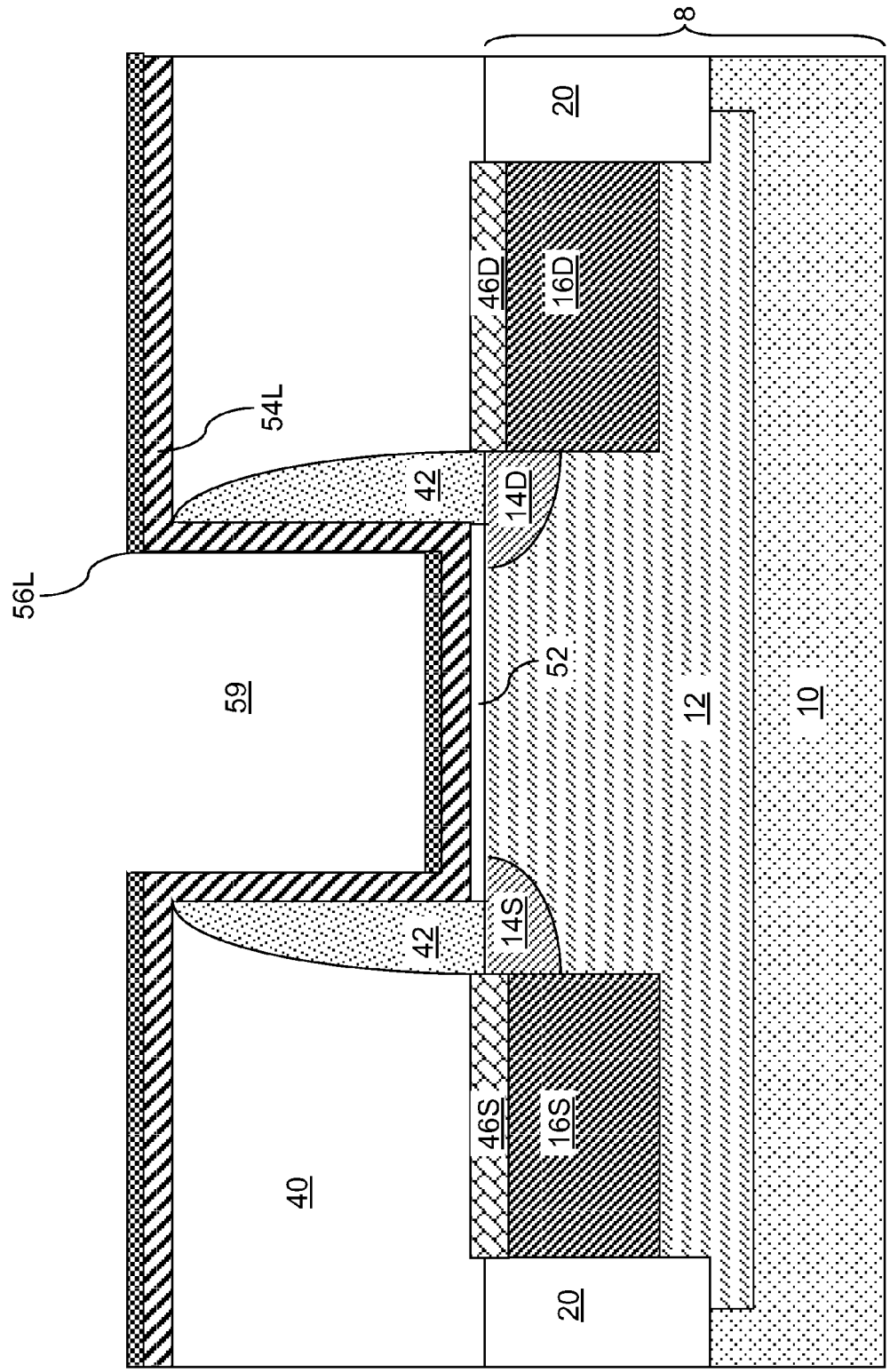
FIG. 8A is a vertical cross-sectional view of a variation of the first exemplary semiconductor structure after deposition of a band-gap-disrupting dielectric layer according to the first embodiment of the present disclosure.

Referring to FIG. 8A, the band-gap-disrupting dielectric layer 56L can be formed as two disjoined horizontal portions including a top portion formed on the top surface of the planarization dielectric layer 40 and a bottom portion formed on the top surface of the horizontal portion of the first high-k dielectric gate dielectric layer 54L according to a variation of the first embodiment. In this variation, the band-gap-disrupting dielectric layer 56L is formed by an anisotropic deposition method that deposits the band-gap-disrupting dielectric layer 56L on horizontal surfaces and does not deposit the band-gap-disrupting dielectric layer 56L on vertical surfaces such as the sidewalls of the first high-k dielectric gate dielectric layer 54L.

In one embodiment, the band-gap-disrupting dielectric layer 56L can be formed by anisotropically depositing a dielectric material selected from $La_2O_3$, $Al_2O_3$, $TiO_2$, $La_2O_uN_v$, $Al_2O_uN_v$, $TiO_uN_v$, and an alloy thereof, wherein each value of u is independently from 0.5 to 3 and each value of v is independently from 0 to 2. The dielectric material of the band-gap-disrupting dielectric layer 56L can be deposited employing methods such as physical vapor deposition (PVD), molecular beam deposition (MBD), pulsed laser deposition (PLD), etc. The deposition temperature of the dielectric material of the band-gap-disrupting dielectric layer 56L is maintained below the temperature above which interatomic diffusion occurs at a detectable level across the first atomic interface so that the inter-diffusion between the material of the first high-k gate dielectric layer 54L and the band-gap-disrupting dielectric layer 56L is suppressed.

In another embodiment, the dielectric material of the band-gap-disrupting dielectric layer 56L can be formed by anisotropically depositing at least one metal selected from La, Al, and Ti on the physically exposed surfaces of the first high-k gate dielectric layer 54L, and subsequently converting the at least one metal into the dielectric material by oxidation and optional nitridation, which can be effected by exposing the surface of the deposited at least one metal to an oxidizing ambient and optionally in a nitridating ambient at an elevated temperature. The at least one metal can be deposited employing methods such as collimated physical vapor deposition (PVD).

Thus, the band-gap-disrupting dielectric layer 56L can be formed by a non-conformal deposition method that forms the band-gap-disrupting dielectric layer 56L as at least two disjoined portions including an upper portion overlying the planarization dielectric layer 40 and a lower portion located underneath a top surface of the planarization dielectric layer 40. The deposition temperature of the at least one metal and the oxidation and/or nitridation temperature are maintained below the temperature above which inter-atomic diffusion occurs at a detectable level across the first atomic interface so that the inter-diffusion between the material of the first high-k gate dielectric layer 54L and the band-gap-disrupting dielectric layer 56L is suppressed. Thus, the first high-k dielectric material of the first high-k gate dielectric layer 54L does not protrude into the band-gap-disrupting dielectric layer 56L across the first atomic interface, and the band-gap-disrupting dielectric material of the band-gap-disrupting dielectric layer 56 does not protrude into the first high-k gate dielectric layer 54L across the first atomic interface.

Figure 9:
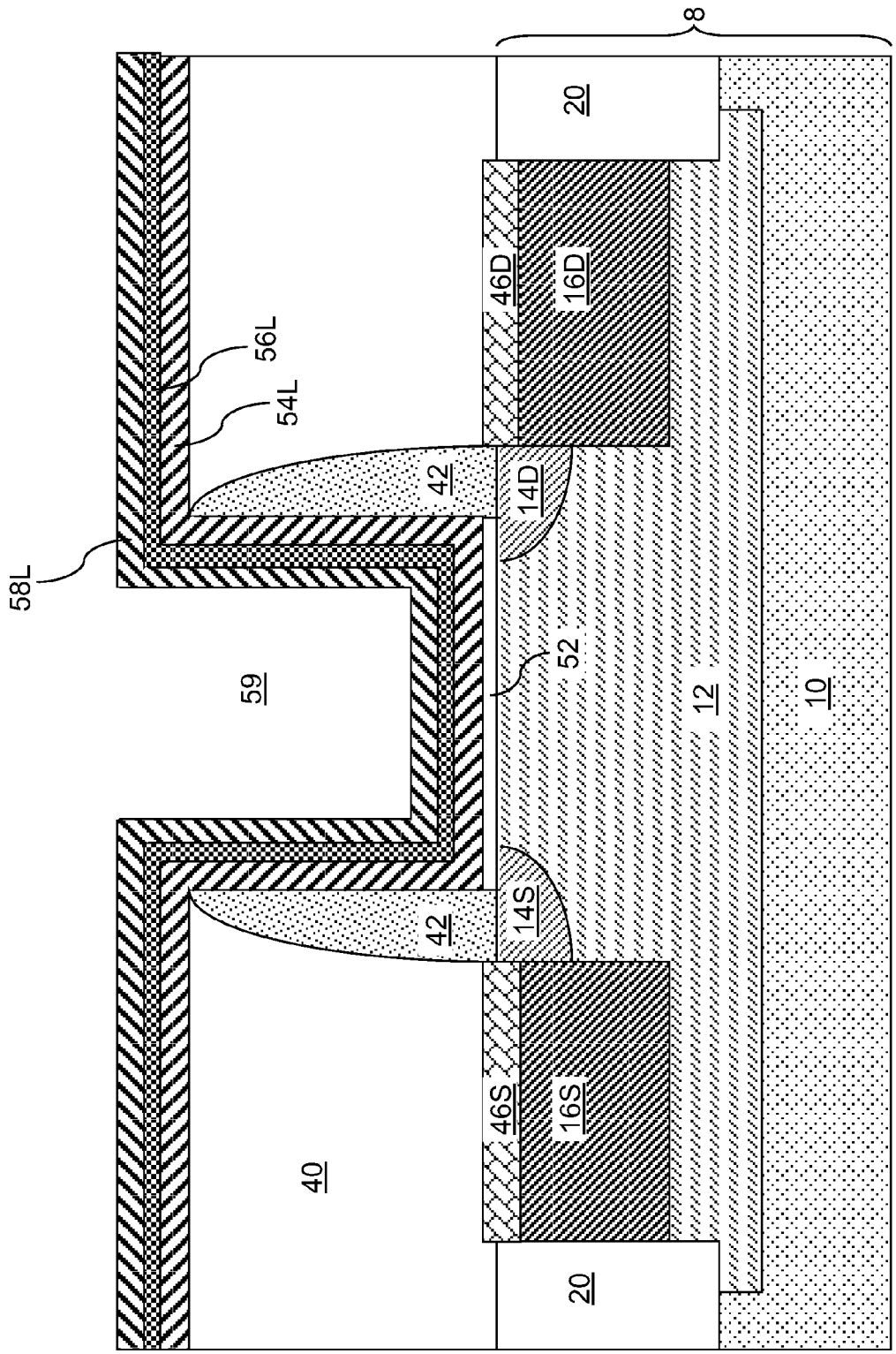
FIG. 9 is a vertical cross-sectional view of the first exemplary semiconductor structure after formation of a second high-k gate dielectric layer according to the first embodiment of the present disclosure.

Referring to FIG. 9, a second high-k gate dielectric layer 58L is formed on all physically exposed surfaces of the band-gap-disrupting dielectric layer 56L. The second high-k gate dielectric layer 58L includes a second high-k dielectric material having a different band gap than the band-gap-disrupting dielectric material of the band-gap-disrupting dielectric layer 56L. The second high-k gate dielectric layer 58L is deposited within the gate cavity 59 and over the planarization dielectric layer 40.

If the band-gap-disrupting dielectric layer 56L is a substantially conformal layer as illustrated in FIG. 8, the second high-k gate dielectric layer 58L is formed directly on the horizontal top surfaces and inner vertical surfaces of the band-gap-disrupting dielectric layer 56L. If the band-gap-disrupting dielectric layer 56L includes only horizontal portions and does not include any vertical portion as illustrated in FIG. 8A, the second high-k gate dielectric layer 58L is formed directly on the horizontal top surfaces of the band-gap-disrupting dielectric layer 56L and the physically exposed portions of the inner sidewalls of the first high-k gate dielectric layer 54L.

In one embodiment, the second high-k dielectric material is the same as the first high-k dielectric material. In this case, any deposition method employed to form the first high-k gate dielectric layer 54L can be formed to form the second high-k gate dielectric layer 58L. The thickness of the second high-k gate dielectric layer 58L, as measured at horizontal portions, can be from 0.3 nm to 3 nm. In one embodiment, the thickness of the second high-k gate dielectric layer 58L can be from 0.4 nm to 1 nm. The second high-k gate dielectric layer 58L may have an effective oxide thickness on the order of or less than 0.5 nm. In one embodiment, the first and second high-k gate dielectric layers (54L, 58L) can be a hafnium oxide ($HfO_2$) layer.

In another embodiment, the second high-k dielectric material can be different from the first high-k dielectric material in composition. The second high-k gate dielectric layer 58L can be formed by depositing a material having a different composition from a composition of the first high-k dielectric material. The second high-k dielectric material can be selected from $HfO_2$, $ZrO_2$, $HfO_pN_q$, $ZrO_pN_q$, and alloys thereof, wherein each value of p is independently from 0.5 to 3 and each value of q is independently from 0 to 2, provided that the composition of the second high-k dielectric material is different from the composition of the first high-k dielectric material.

The second high-k dielectric material can be deposited by methods such as chemical vapor deposition (CVD), physical vapor deposition (PVD), molecular beam deposition (MBD), pulsed laser deposition (PLD), liquid source misted chemical deposition (LSMCD), atomic layer deposition (ALD), etc. The second high-k gate dielectric layer 58L can be formed as a contiguous layer, i.e., a layer without having a hole therein at atomic level. In one embodiment, the second high-k dielectric layer 58L can be formed as a substantially conformal layer. The thickness of the second high-k gate dielectric layer 58L, as measured at horizontal portions, can be from 0.3 nm to 3 nm. In one embodiment, the thickness of the second high-k gate dielectric layer 54L can be from 0.4 nm to 1 nm. The second high-k gate dielectric layer 58L may have an effective oxide thickness on the order of or less than 0.5 nm. In one embodiment, the second high-k gate dielectric layer 58L can be a zirconium oxide ($ZrO_2$) layer.

The deposition temperature of the second high-k gate dielectric layer 58L is maintained below the temperature above which inter-atomic diffusion occurs at a detectable level across the interface between the second high-k gate dielectric layer 58L and the band-gap-disrupting dielectric layer 56L so that the inter-diffusion between the material of the second high-k gate dielectric layer 58L and the band-gap-disrupting dielectric layer 56L is suppressed. The temperature above which inter-atomic diffusion occurs at a detectable level across the interface between the first high-k gate dielectric layer 54L and the band-gap-disrupting dielectric layer 56L is less than 800 degrees Celsius, and is typically in a range between 700 degrees Celsius and 800 degrees Celsius. Thus, a second atomic interface is formed between the band-gap-disrupting dielectric layer 56L and the second high-k gate dielectric layer 58L. The second atomic interface can include a horizontal portion and a pair of vertical portions as illustrated in FIG. 9, or can consist of horizontal portions if the variation illustrated in FIG. 8A is employed. Thus, the second high-k dielectric material of the second high-k gate dielectric layer 58L does not protrude into the band-gap-disrupting dielectric layer 56 across the second atomic interface, and the band-gap-disrupting dielectric material of the band-gap-disrupting dielectric layer 56L does not protrude into the second high-k gate dielectric layer 58L across the second atomic interface. Thus, the first atomic interface and the second atomic interface are planar at the atomic level.

The first atomic interface between the band-gap-disrupting dielectric layer 56L and the first high-k gate dielectric layer 54L is spaced from a second atomic interface between the band-gap-disrupting dielectric layer 56L and the second high-k gate dielectric layer 58L by at least one continuous atomic layer of the dielectric material of the band-gap-disrupting dielectric layer 56L.

Figure 10:
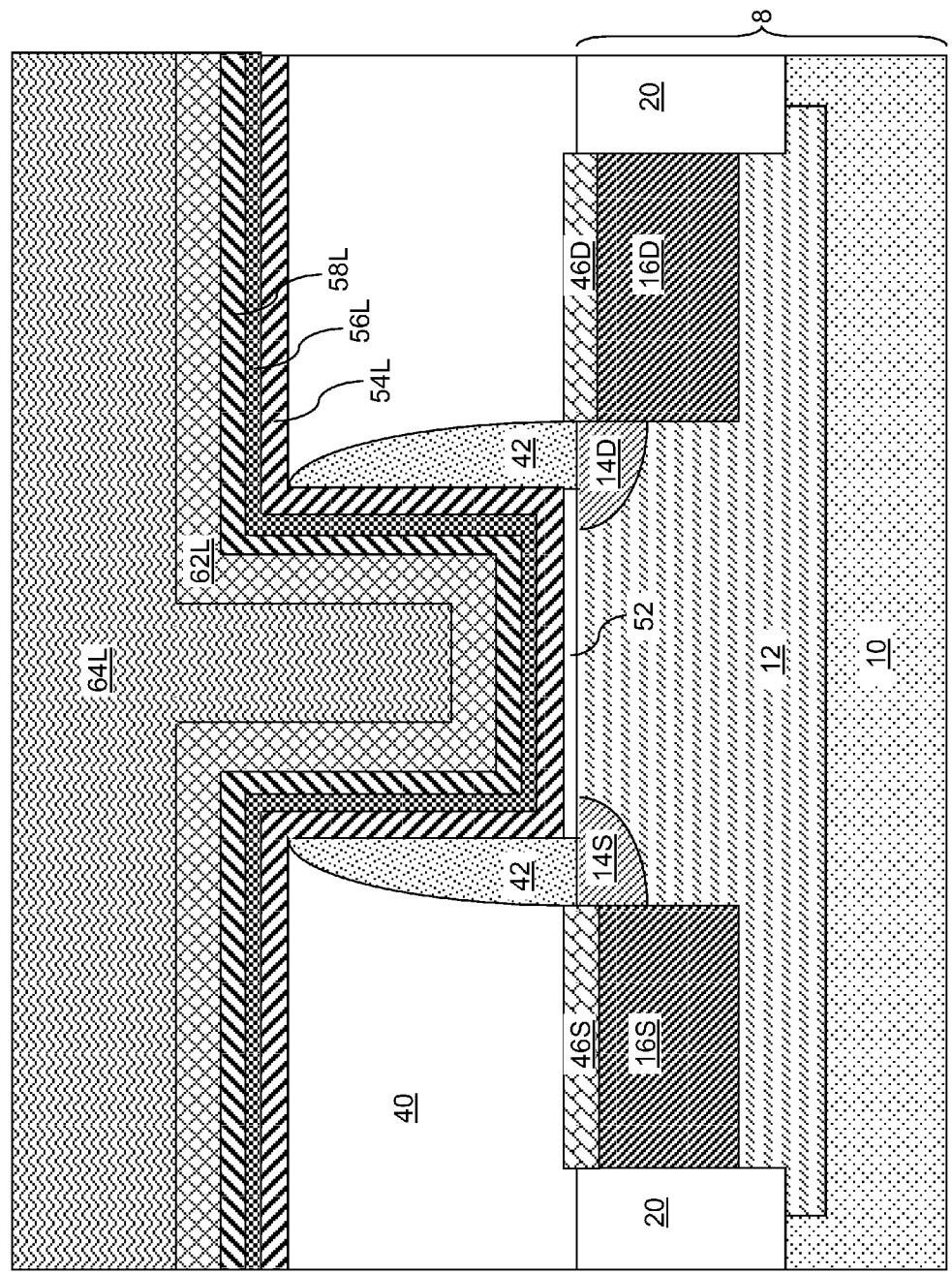
FIG. 10 is a vertical cross-sectional view of the first exemplary semiconductor structure after formation of a work function material layer and a conductive material layer according to the first embodiment of the present disclosure.

Referring to FIG. 10, a work function material layer 62L is formed directly on the second high-k dielectric layer 58L and within the gate cavity 59. The work function material layer 62L includes a metallic material adjusting the work function of the gate electrode of the field effect transistor to be formed. The work function material layer 62L can be a p-type work function material layer or an n-type work function material layer. As used herein, a "p-type work function material" refers to a material having a work function that is between the valence band energy level of silicon and the mid band gap energy level of silicon, i.e., the energy level equally separated from the valence band energy level and the conduction band energy level of silicon. As used herein, an "n-type work function material" refers to a material having a work function that is between the conduction band energy level of silicon and the mid band gap energy level of silicon.

In one embodiment, the work function material layer 62L can include at least one metal selected from Hf, Ti, Zr, Cd, La, Tl, Yb, Al, Ce, Eu, Li, Pb, Tb, Bi, In, Lu, Nb, Sm, V, Zr, Ga, Mg, Gd, Y, TiAl, TaN, Pt, Rh, Ir, Ru, Cu, Os, Be, Co, Pd, Te, Cr, Ni, TiN, a stack thereof, a conductive oxide thereof, a conductive nitride thereof, an alloy thereof, and a combination thereof.

The work function material layer 62L can be deposited, for example, by physical vapor deposition (PVD), atomic layer deposition (ALD) or chemical vapor deposition (CVD). The thickness of the horizontal portions of the work function material layer 62L at the bottom of the gate cavity 59 can be from 2.5 nm to 10 nm, although lesser and greater thicknesses can also be employed.

Subsequently, a conductive material layer 64L is formed directly on the work function material layer 62L and within the gate cavity 59, which is filled with the material of the conductive material layer 64L. The conductive material layer 64L can include a metal. The conductive material layer 64L can be deposited by physical vapor deposition, atomic layer deposition (ALD) or chemical vapor deposition. For example, the conductive material layer 64L can be an aluminum layer or an aluminum alloy layer deposited by physical vapor deposition or a tungsten layer or a tungsten alloy layer deposited by chemical vapor deposition. The thickness of the conductive material layer 64L, as measured in a planar region of the conductive material layer 64L above the top surface of the planarization dielectric layer 40, can be from 100 nm to 500 nm, although lesser and greater thicknesses can also be employed. In one embodiment, the conductive material layer 64L can include at least one material selected from Al, W, Co, and Cu. Further, the conductive material layer 64L can consist essentially of a single elemental metal such as Al, W, Co, or Cu. For example, the conductive material layer 64L can consist essentially of aluminum. The conductive material layer 64L can be reflowed at a temperature that is lower than a temperature that induces diffusion across the first atomic interface or the second atomic interface. Any thermal processing after formation of the second atomic interface is performed at a temperature that is lower than the temperature that induces diffusion across the first atomic interface or the second atomic interface.

Figure 11:
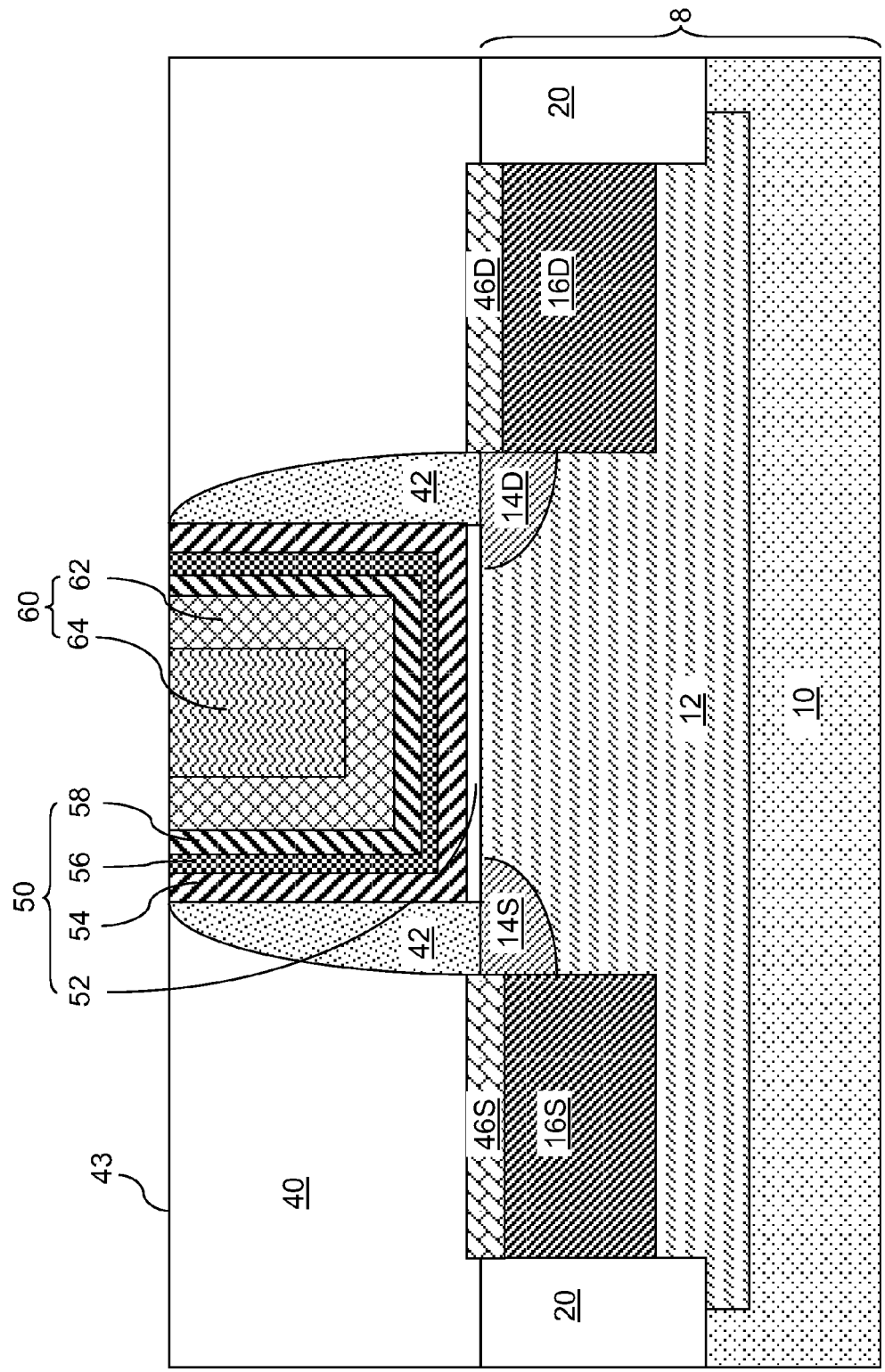
FIG. 11 is a vertical cross-sectional view of the first exemplary semiconductor structure after formation of a gate dielectric including a stratified gate dielectric stack and a gate electrode according to the first embodiment of the present disclosure.

Referring to FIG. 11, a stratified gate dielectric stack and a gate electrode are formed. As used herein, a "stratified" element refers to an element including at least one pair of sub-elements having an atomic interface there between. The stratified gate dielectric stack is formed by patterning the stack including the interfacial dielectric 52, the first high-k gate dielectric layer 54L the band-gap-disrupting dielectric layer 56L, and the second high-k gate dielectric layer 58L. The gate electrode is formed by patterning the stack of the conductive material layer 64L and the work function material layer 62L.

In one embodiment, formation of the stratified gate dielectric stack by patterning of the stack including the interfacial dielectric 52, the first high-k gate dielectric layer 54L the band-gap-disrupting dielectric layer 56L, and the second high-k gate dielectric layer 58L and formation of the gate electrode by patterning the stack of the conductive material layer 64L and the work function material layer 62L can be concurrently performed by planarization. In one embodiment, the conductive material layer 64L, the work function material layer 62L, the second high-k gate dielectric layer 58L, the band-gap-disrupting dielectric layer 56L, and the first high-k gate dielectric layer 54L are planarized, for example, by chemical mechanical planarization to form the stratified gate dielectric stack. Specifically, portions of the conductive material layer 64L, the work function material layer 62L, the second high-k gate dielectric layer 58L, the band-gap-disrupting dielectric layer 56L, and the first high-k gate dielectric layer 54L are removed from above the planar dielectric surface 43 of the planarization dielectric layer 40 during the planarization step.

The remaining portion of the first high-k gate dielectric layer 54L constitutes a first high-k gate dielectric 54, the remaining portion of the band-gap-disrupting dielectric layer 56L constitutes a band-gap-disrupting gate dielectric 56, and the remaining portion of the second high-k gate dielectric layer 58L constitutes a second high-k gate dielectric 58. The stratified gate dielectric stack includes the interfacial dielectric 52, the first high-k gate dielectric 54, the band-gap-disrupting gate dielectric 56, and the second high-k gate dielectric 58. Thus, the stratified gate dielectric stack 50 includes: an interfacial dielectric 52, a first high dielectric constant (high-k) gate dielectric 64 including a first high-k dielectric material and located on a semiconductor substrate 8; a band-gap-disrupting dielectric 56 including a dielectric material having a different band gap than the first high-k gate dielectric; and a second high-k gate dielectric 58 including a second high-k dielectric material having a different band gap than the band-gap-disrupting dielectric. The stratified gate dielectric stack 50 is the gate dielectric of the field effect transistor in the first exemplary structure. The band-gap-disrupting dielectric 56 includes a horizontal portion and vertical portions, and has a substantially same thickness throughout, i.e., a same thickness within the measurement limit of analytical instruments.

The remaining portion of the work function material layer 62L constitutes a work function material portion 62, and the remaining portion of the conductive material layer 64L constitutes a conductive material portion 64. The work function material portion 62 and the conductive material portion 64 constitute a gate electrode 60, which is the gate electrode of the field effect transistor in the first exemplary structure. The work function material portion 62 is embedded within the second high-k dielectric 58, and the conductive material portion 64 is embedded within the work function material portion 62.

The first high-k dielectric material of the first high-k gate dielectric 54 is preserved to be substantially free of the dielectric material of the band-gap-disrupting dielectric 56 during formation of the stratified gate dielectric stack 50, and until the end of the manufacturing process for the first exemplary semiconductor structure, i.e., at least until at least the field effect transistor is incorporated into a functional semiconductor chip. As used herein, a first material is substantially free of a second material if the second material cannot be detected by analytical instruments known in the art. For example, an impurity high-k dielectric material embedded within a layer of a high-k dielectric material having a thickness less than 6 nm cannot be detected if the impurity level is less than 100 p.p.m. (parts per million).

Further, the second high-k dielectric material of the second high-k gate dielectric 58 is preserved to be substantially free of the dielectric material of the band-gap-disrupting dielectric 56 during formation of the stratified gate dielectric stack 50, and until the end of the manufacturing process for the first exemplary semiconductor structure, i.e., at least until at least the field effect transistor is incorporated into a functional semiconductor chip.

Yet further, the band-gap-disrupting dielectric material of the band-gap-disrupting dielectric 56 is preserved to be substantially free of the first high-k dielectric material and the second high-k dielectric material during formation of the stratified gate dielectric stack 50, and until the end of the manufacturing process for the first exemplary semiconductor structure, i.e., at least until at least the field effect transistor is incorporated into a functional semiconductor chip.

Therefore, the first atomic interface between the band-gap-disrupting dielectric 56 and the first high-k gate dielectric 52 is spaced from the second atomic interface between the band-gap-disrupting dielectric 56 and the second high-k gate dielectric 58 by at least one continuous atomic layer of the dielectric material of the band-gap-disrupting dielectric 56 within the stratified gate dielectric stack 50 during formation of the stratified gate dielectric stack 50, and until the end of the manufacturing process for the first exemplary semiconductor structure, i.e., at least until at least the field effect transistor is incorporated into a functional semiconductor chip. Keeping each of the first high-k gate dielectric 54, the band-gap-disrupting dielectric 56, and the second high-k gate dielectric 56 free of diffusion across the first and second atomic interfaces can be effected by maintaining the stratified gate dielectric stack 50 under a temperature that induces detectable interdiffusion of materials across the first atomic interface or the second atomic interface at least until at least said field effect transistor is incorporated into a functional semiconductor chip.

The stratified gate dielectric stack 50 provides the same shift to the work function of the gate electrode 60 of the field effect transistor as a hypothetical gate dielectric stack derived by omitting the band-gap-disrupting dielectric 56 from the stratified gate dielectric stack 50. In other words, the stratified gate dielectric stack 50 provides the same shift to the work function of the gate electrode 60 of the field effect transistor as a hypothetical gate dielectric stack consisting of, form bottom to top, the interfacial dielectric 52, the first high-k gate dielectric 54, and the second high-k gate dielectric 58.

In one embodiment, the first high-k gate dielectric 54 can be a first U-shaped high-k gate dielectric having a horizontal portion and a pair of vertical portions, the band-gap-disrupting dielectric 56 can be a U-shaped band-gap-disrupting dielectric having a horizontal portion and a pair of vertical portions, and the second high-k dielectric 58 can be a U-shaped band-gap-disrupting dielectric having a horizontal portion and a pair of vertical portions. The topmost surfaces of the first U-shaped high-k gate dielectric, the U-shaped band-gap-disrupting dielectric, and the U-shaped band-gap-disrupting dielectric can be located within a same horizontal plane, which is coplanar with the planar dielectric surface 43 of the planarization dielectric layer 40.

In one embodiment, each of the first atomic interface and the second atomic interface can include a horizontal atomic interface portion and a pair of vertical atomic interface portions that are parallel to each other as illustrated in FIG. 11.

Figure 12:
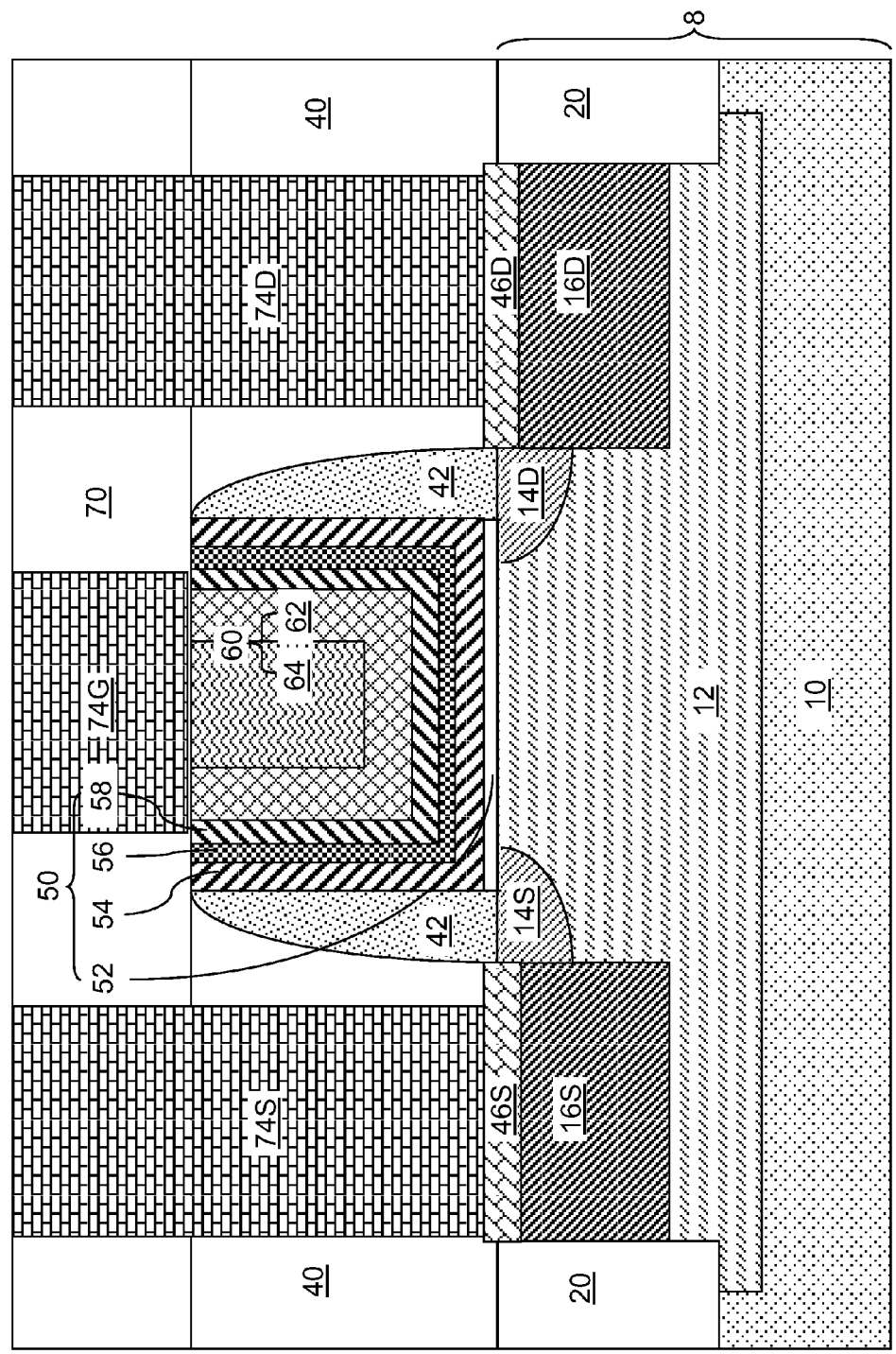
FIG. 12 is a vertical cross-sectional view of the first exemplary semiconductor structure after formation of a contact level dielectric layer and contact via structures according to the first embodiment of the present disclosure.

Referring to FIG. 12, a contact level dielectric layer 70 is deposited over the planarization dielectric layer 40. Various contact via structures can be formed, for example, by formation of contact via cavities by a combination of lithographic patterning and an anisotropic etch followed by deposition of a metal and planarization that removes an excess portion of the metal from above the contact level dielectric layer 70. The various contact via structures can include, for example, a source contact via structure 74S in contact with the source-side metal semiconductor alloy portion 46S, a drain contact via structure 74D in contact with the drain-side metal semiconductor alloy portion 46D, and a gate contact via structure 74G in contact with the electrode 60. In the first exemplary structure of FIG. 12, the semiconductor substrate 8 is a bulk semiconductor substrate and the field effect transistor is a planar field effect transistor.

Figure 12A:
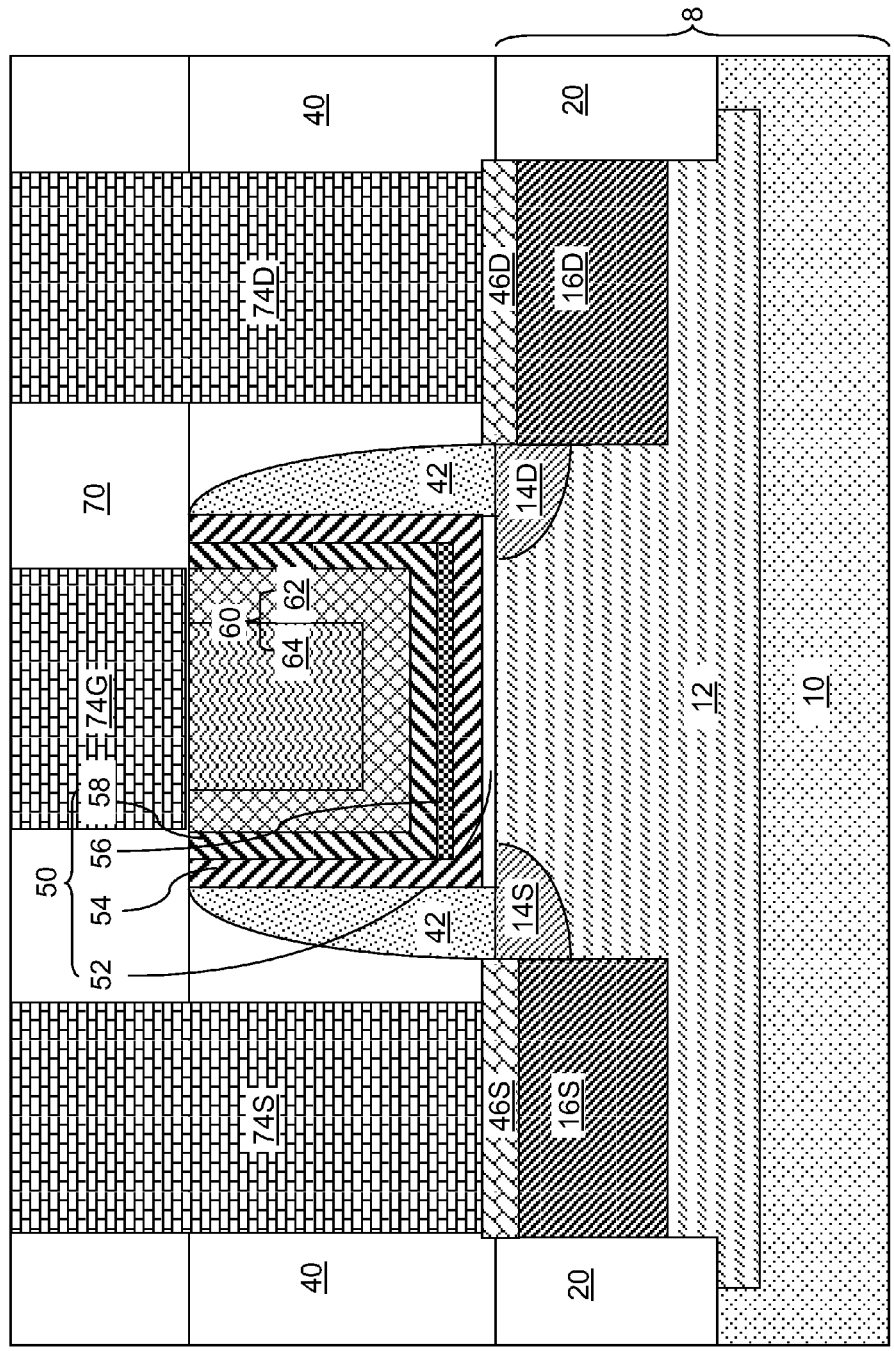
FIG. 12A is a vertical cross-sectional view of a first variation of the first exemplary semiconductor structure after formation of a contact level dielectric layer and contact via structures according to the first embodiment of the present disclosure.

Referring to FIG. 12A, a first variation of the first exemplary semiconductor structure is shown at the processing step corresponding to FIG. 12. In this embodiment, each of the first atomic interface and the second atomic interface can include a horizontal atomic interface portion and does not include any vertical atomic interface portion. A vertical portion of the second high-k gate dielectric layer 58L is deposited directly on a sidewall of the first high-k gate dielectric layer 54L at a processing step corresponding to FIG. 9. The inner sidewalls of the first high-k gate dielectric 54 are in physical contact with the outer sidewalls of the second high-k gate dielectric 58. The band-gap-disrupting dielectric 56 is a planar layer having a same thickness throughout. A vertical portion of the second high-k gate dielectric 58 contacts a sidewall of the first high-k gate dielectric 54. In the first variation of the first exemplary structure of FIG. 12A, the semiconductor substrate 8 is a bulk semiconductor substrate and the field effect transistor is a planar field effect transistor.

Figure 12B:
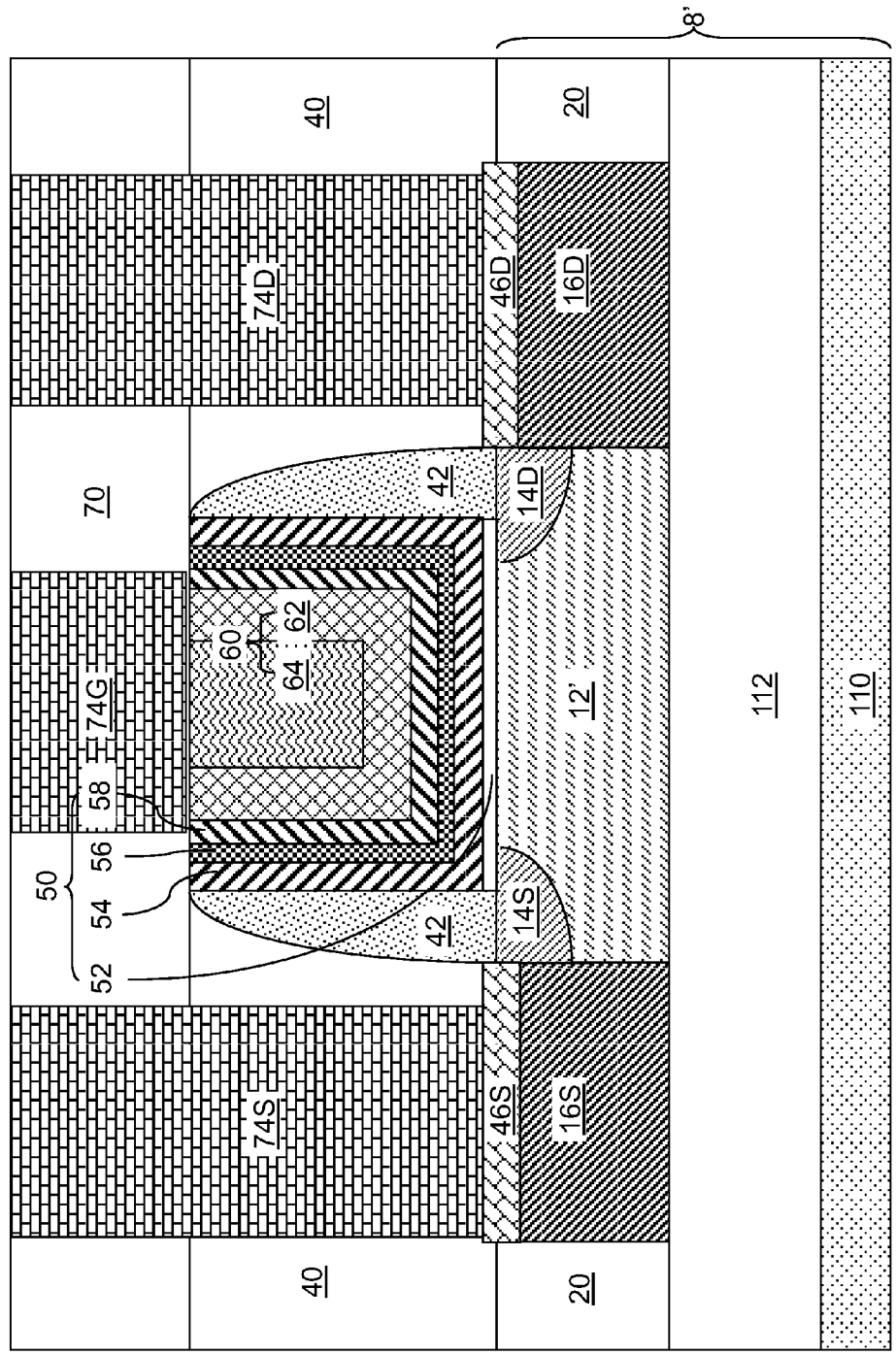
FIG. 12B is a vertical cross-sectional view of a second variation of the first exemplary semiconductor structure after formation of a contact level dielectric layer and contact via structures according to the first embodiment of the present disclosure.

Referring to FIG. 12B, a second variation of the first exemplary semiconductor structure is shown at the processing step corresponding to FIG. 12. The second variation of the first exemplary semiconductor structure can be derived from the first semiconductor structure by employing a semiconductor-on-insulator substrate 8' including a stack of a handle substrate 110, a buried insulator layer 112, and a top semiconductor layer in which shallow trench isolation structures 20, a source region 16S, a drain region 16D, a source extension region 14S, a drain extension region 14D, and a body region 12' that is a remaining portion of an active region are formed. In the second variation of the second exemplary structure of FIG. 12B, the semiconductor substrate 8' is a semiconductor-on-insulator substrate and the field effect transistor is a planar field effect transistor.

Figure 12C:
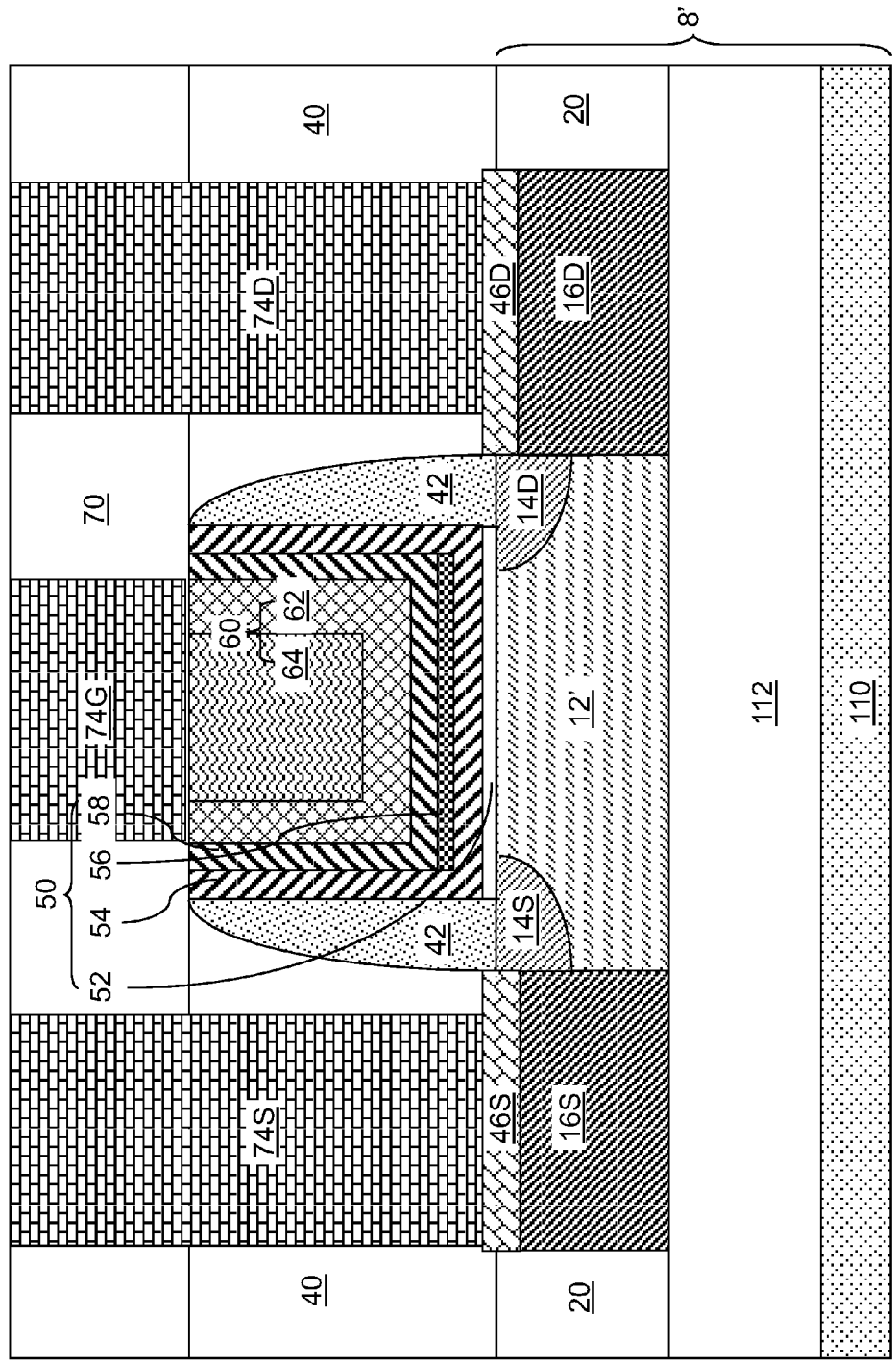
FIG. 12C is a vertical cross-sectional view of a third variation of the first exemplary semiconductor structure after formation of a contact level dielectric layer and contact via structures according to the first embodiment of the present disclosure.

Referring to FIG. 12C, a third variation of the first exemplary semiconductor structure is shown at the processing step corresponding to FIG. 12A. The third variation of the first exemplary semiconductor structure can be derived from the first variation of the first semiconductor structure by employing a semiconductor-on-insulator substrate 8' including a stack of a handle substrate 110, a buried insulator layer 112, and a top semiconductor layer in which shallow trench isolation structures 20, a source region 16S, a drain region 16D, a source extension region 14S, a drain extension region 14D, and a body region 12' that is a remaining portion of an active region are formed. In the third variation of the first exemplary structure of FIG. 12C, the semiconductor substrate 8' is a semiconductor-on-insulator substrate and the field effect transistor is a planar field effect transistor.

Figure 12D:
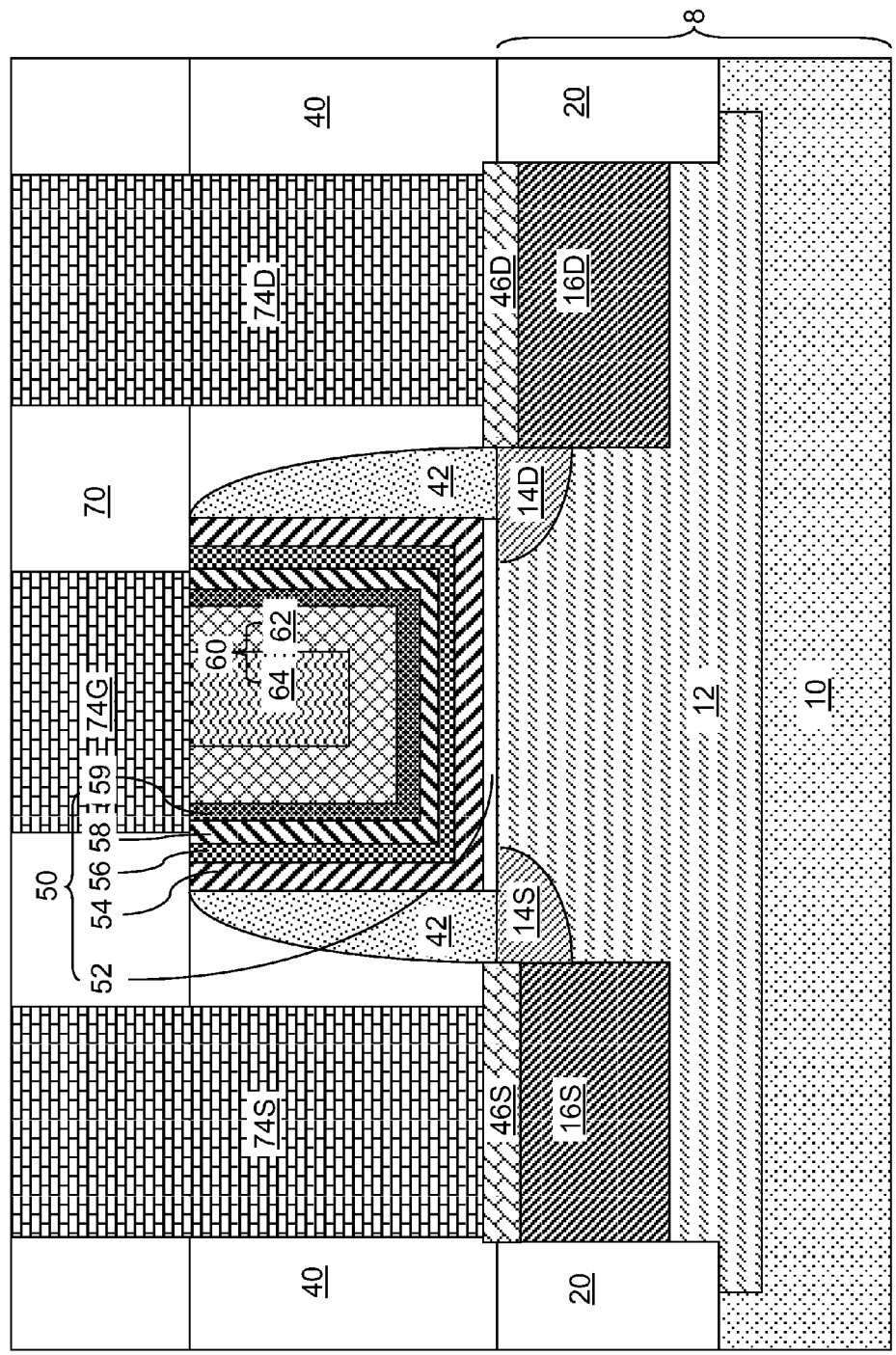
FIG. 12D is a vertical cross-sectional view of a fourth variation of the first exemplary semiconductor structure after formation of a contact level dielectric layer and contact via structures according to the first embodiment of the present disclosure.

Referring to FIG. 12D, a fourth variation of the first exemplary semiconductor structure is shown at the processing step corresponding to FIG. 12. The fourth variation of the first exemplary semiconductor structure can be derived from the first semiconductor structure or by first, second, or third variations thereof by depositing an additional high-k gate dielectric layer comprising another high-k dielectric material after deposition of the second high-k gate dielectric layer 58L and before deposition of the work function material layer 62L. The remaining portion of the additional high-k gate dielectric layer constitutes an additional high-k gate dielectric 59, which is present between the second high-k gate dielectric 58 and the work function material portion 62. The material of the additional high-k gate dielectric is different from the material of the second high-k gate dielectric 58, and can be any material that can be employed for the first high-k gate dielectric 54 or the band-gap-disrupting dielectric 56. The material of the additional high-k gate dielectric can be selected from $La_2O_3$, $Al_2O_3$, $TiO_2$, $HfO_2$, $ZrO_2$, $La_2O_sN_t$, $Al_2O_sN_t$, $TiO_xN_t$, $HfO_sN_t$, $ZrO_sN_t$ and an alloy thereof, wherein each value of s is independently from 0.5 to 3 and each value of t is independently from 0 to 2. The thickness of the additional high-k gate dielectric 59, as measured at horizontal portions, can be from 0.3 nm to 3 nm although lesser and greater thicknesses can also be employed. In one embodiment, the thickness of the additional high-k gate dielectric 59 can be from 0.4 nm to 1 nm. The additional high-k gate dielectric 59 may have an effective oxide thickness on the order of or less than 0.5 nm.

Figure 12E:
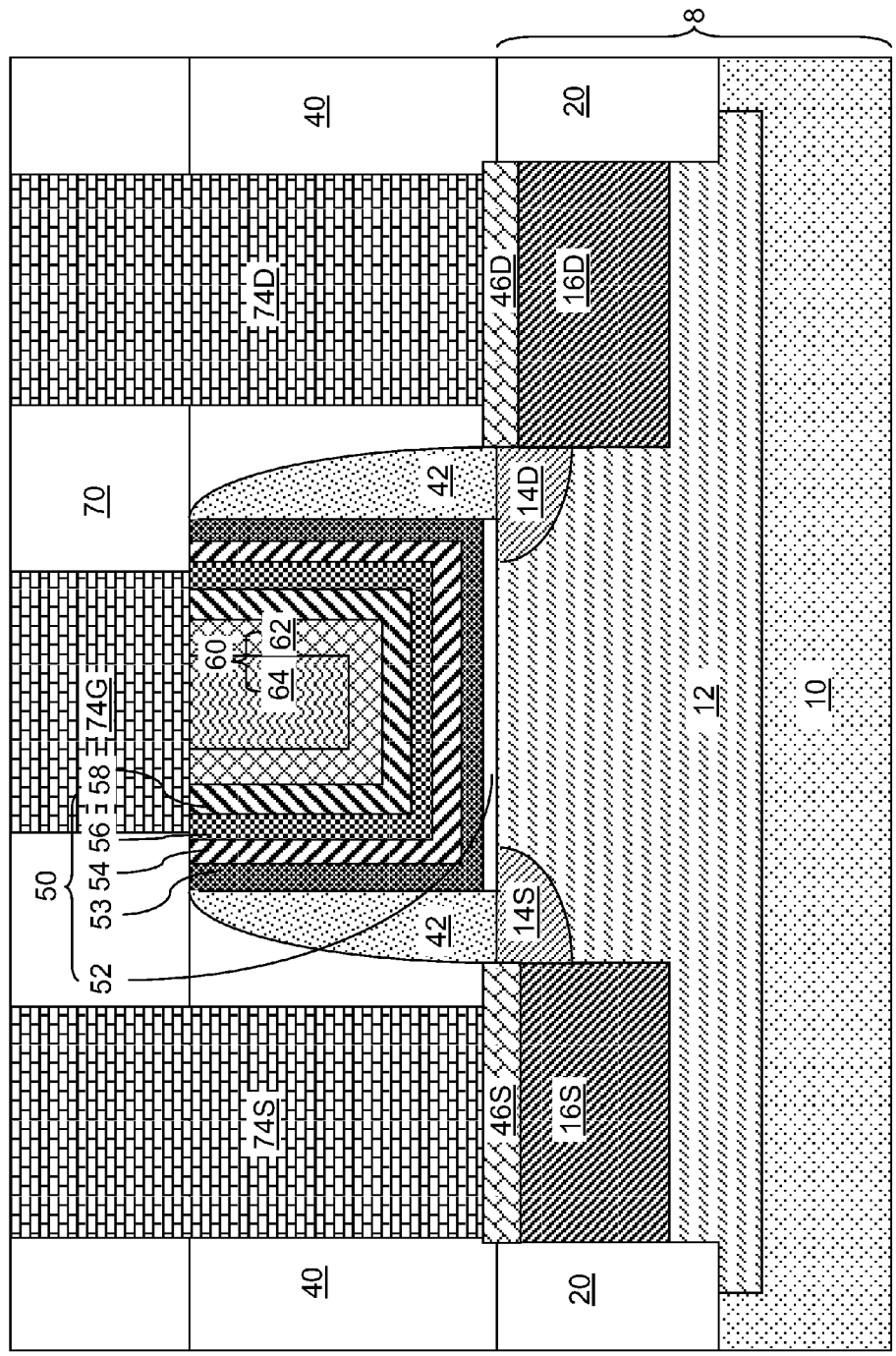
FIG. 12E is a vertical cross-sectional view of a fifth variation of the first exemplary semiconductor structure after formation of a contact level dielectric layer and contact via structures according to the first embodiment of the present disclosure.

Referring to FIG. 12E, a fifth variation of the first exemplary semiconductor structure is shown at the processing step corresponding to FIG. 12. The fifth variation of the first exemplary semiconductor structure can be derived from the first semiconductor structure or by first, second, or third variations thereof by depositing an additional high-k gate dielectric layer comprising another high-k dielectric material after formation of the interfacial dielectric 52 and before deposition of the first high-k gate dielectric layer 58L. The remaining portion of the additional high-k gate dielectric layer constitutes an additional high-k gate dielectric 53, which is present between the interfacial dielectric 52 and the first high-k gate dielectric 54. The material of the additional high-k gate dielectric can be any material that can be employed for the first high-k gate dielectric 54 or the band-gap-disrupting dielectric 56, provided that the material of the additional high-k gate dielectric is different from the material of the first high-k gate dielectric 54. The material of the additional high-k gate dielectric can be selected from $La_2O_3$, $Al_2O_3$, $TiO_2$, $HfO_2$, $ZrO_2$, $La_2O_sN_t$, $Al_2O_sN_t$, $TiO_sN_t$, $HfO_sN_t$, $ZrO_sN_t$ and an alloy thereof, wherein each value of s' is independently from 0.5 to 3 and each value of t' is independently from 0 to 2. The thickness of the additional high-k gate dielectric 53, as measured at horizontal portions, can be from 0.3 nm to 3 nm although lesser and greater thicknesses can also be employed. In one embodiment, the thickness of the additional high-k gate dielectric 53 can be from 0.4 nm to 1 nm. The additional high-k gate dielectric 53 may have an effective oxide thickness on the order of or less than 0.5 nm.

Figure 13:
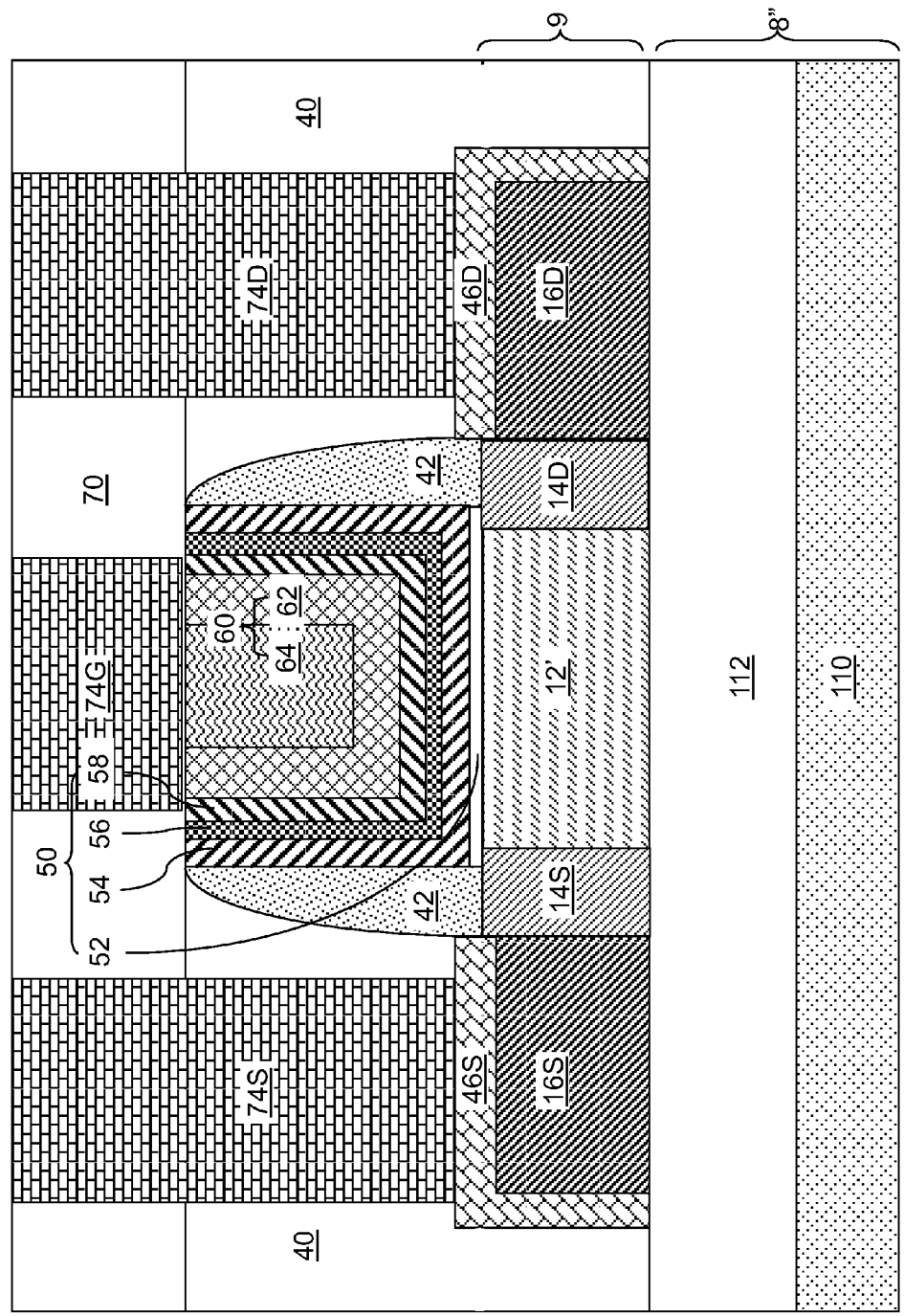
FIG. 13 is a vertical cross-sectional view of a second exemplary semiconductor structure including a finFET (fin field effect transistor) having a gate dielectric including a stratified gate dielectric stack according to a second embodiment of the present disclosure.

Referring to FIG. 13, a second exemplary semiconductor structure including a finFET having a gate dielectric 50 including a stratified gate dielectric stack is shown according to a second embodiment of the present disclosure. A semiconductor-on-insulator (SOI) substrate including a handle substrate 110, a buried insulator layer 112, and a top semiconductor layer can be employed to form a semiconductor fin 9 on a substrate 8' including the stack of the handle substrate 110 and the buried insulator layer 112. A body region 12', a source extension region 14S, a drain extension region 14D can be formed within the semiconductor fin 9 prior to formation of a disposable gate structure straddling over the semiconductor fin 9. In the second exemplary semiconductor structure, the semiconductor fin 9 formed on a stack, from bottom to top, of a handle substrate 110 and a buried insulator layer 112 constitutes a semiconductor substrate.

The processing steps of FIGS. 1-7, one of 8 and 8A, 9-11, and one of 12 and 12A are performed with the substitution of the planar structure with a fin structure to provide the second exemplary structure of FIG. 13. The second exemplary structure of FIG. 13 shows that the semiconductor fin 9 includes the body region 12', the source extension region 14S, the drain extension region 14D, a source region 16S, and a drain region 16D. The gate electrode 60, which is a replacement gate electrode, straddles over the middle portion of the semiconductor fin 9.

Figure 13A:
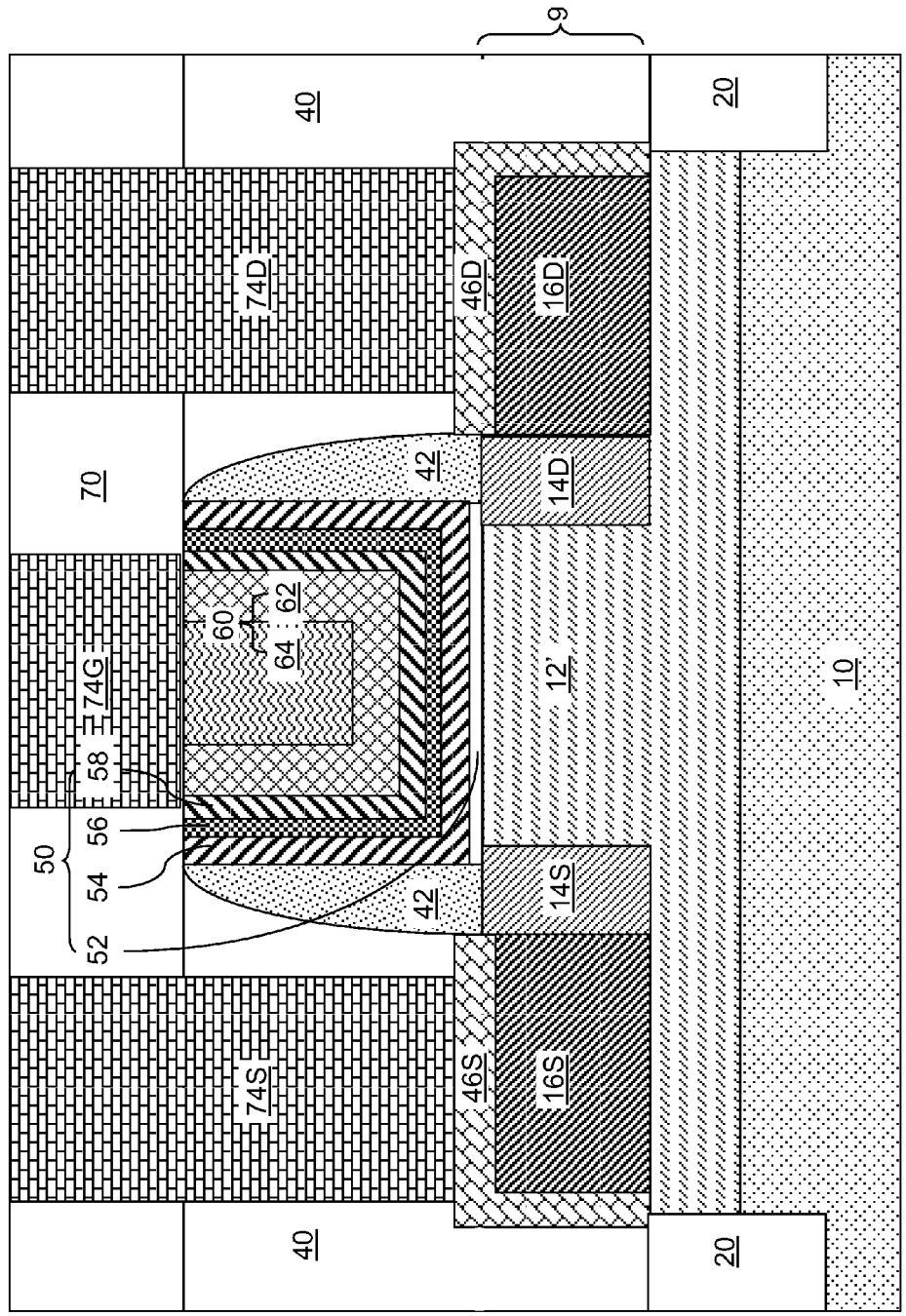
FIG. 13A is a vertical cross-sectional view of a variation of the second exemplary semiconductor structure including a finFET having a gate dielectric including a stratified gate dielectric stack according to the second embodiment of the present disclosure.

Referring to FIG. 13A, a variation of the second exemplary semiconductor structure including a finFET having a gate dielectric 50 including a stratified gate dielectric stack is shown according to the second embodiment of the present disclosure. An upper portion of a bulk semiconductor substrate can be doped to form an active region and an underlying semiconductor layer 10. The upper portion of the active region is patterned to form a semiconductor fin 9. Shallow trench isolation structures 20 are formed around the semiconductor fin 9 by depositing a dielectric material and vertically recessing the dielectric material. A body region 12', a source extension region 14S, a drain extension region 14D can be formed within the semiconductor fin 9 prior to formation of a disposable gate structure straddling over the semiconductor fin 9. A semiconductor substrate includes the semiconductor fin 9 formed on a bulk semiconductor substrate that includes the underlying semiconductor layer 110 and a lower portion of the body region 12' that underlies the plane of the bottom surface of the source region 16S and the drain region 16D.

The processing steps of FIGS. 1-7, one of 8 and 8A, 9-11, and one of 12 and 12A are performed with the substitution of the planar structure with a fin structure to provide the variation of the second exemplary structure of FIG. 13A. The variation of the second exemplary structure of FIG. 13A shows that the semiconductor fin 9 includes the body region 12', the source extension region 14S, the drain extension region 14D, a source region 16S, and a drain region 16D. The gate electrode 60, which is a replacement gate electrode, straddles over the middle portion of the semiconductor fin 9.

Figure 14:
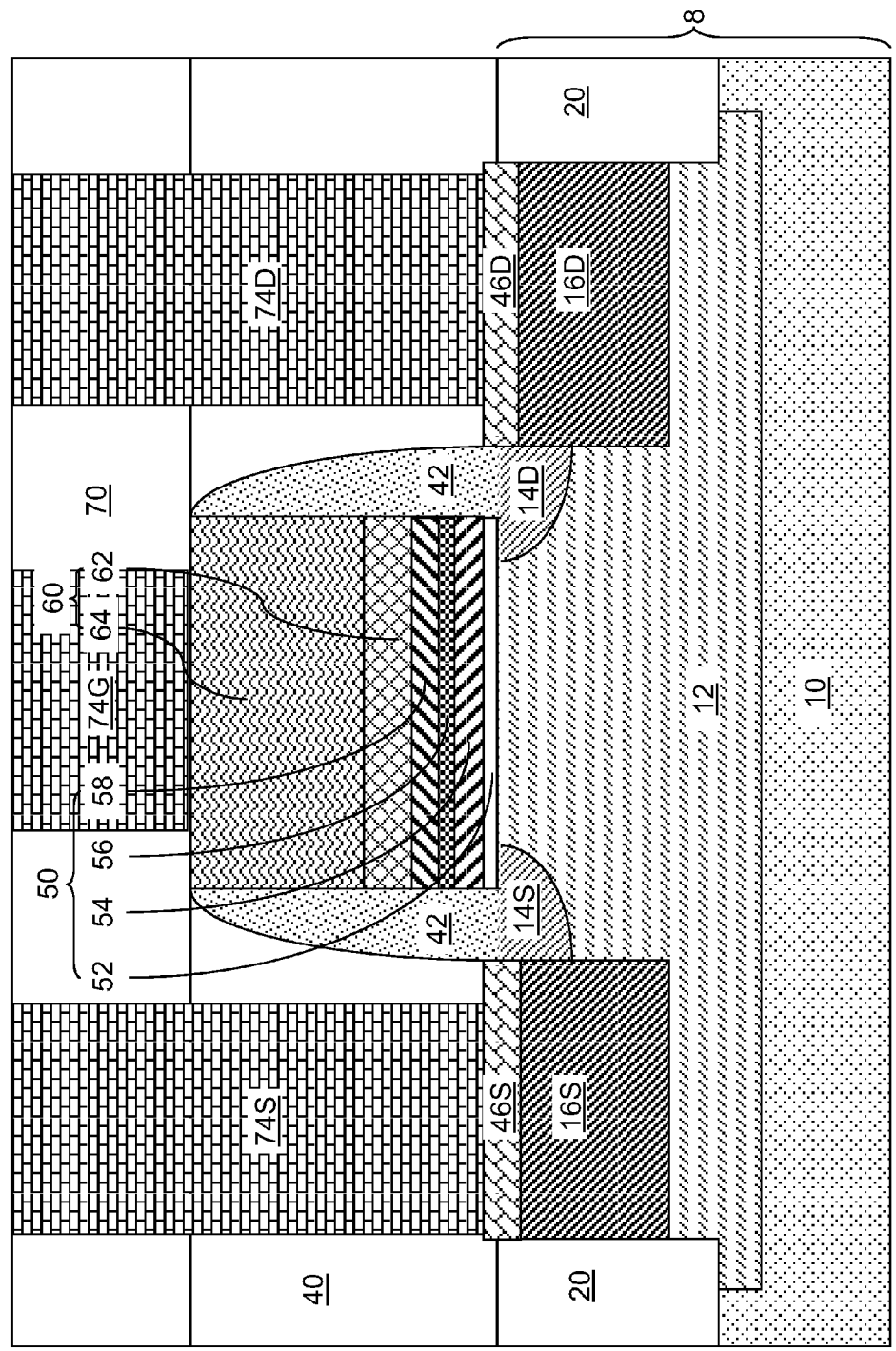
FIG. 14 is a vertical cross-sectional view of a third exemplary semiconductor structure including a planar field effect transistor having a gate dielectric including a stratified gate dielectric stack formed by a gate-first integration scheme that does not employ a disposable gate structure according to a third embodiment of the present disclosure.

Referring to FIG. 14, a third exemplary semiconductor structure according to a third embodiment of the present disclosure is shown. In the third exemplary semiconductor structure, after formation of an interfacial dielectric layer, each of the first high-k gate dielectric layer 54L, the band-gap-disrupting dielectric layer 56L, the second high-k gate dielectric layer 58L, the work function material layer 62L, and the conductive material layer 64L, the work function material layer, and the conductive material layer 64L is deposited as planar layers below a temperature above which inter-atomic diffusion occurs at a detectable level across the first atomic interface or across the second atomic interface in lieu of deposition of the disposable gate level layers (23L, 27L, 29L) illustrated in FIG. 1. The temperature above which the inter-atomic diffusion occurs across the first atomic interface or across the second atomic interface is less than 800 degrees Celsius, and is typically in a range between 700 degrees Celsius and 800 degrees Celsius.

Each of the first high-k dielectric layer 54L, the band-gap-disrupting dielectric layer 56L, and the second high-k dielectric layer 58L is deposited as a planar layer having a planar to surface that extends over an entirety of the semiconductor substrate 8. The stack of the interfacial dielectric layer, the first high-k gate dielectric layer 54L, the band-gap-disrupting dielectric layer 56L, the second high-k gate dielectric layer 58L, the work function material layer 62L, and the conductive material layer 64L, the work function material layer, and the conductive material layer 64L is lithographically patterned to form the stratified gate dielectric stack 50 and the gate electrode 60. The gate spacer 42 and the planarization dielectric layer 40 are subsequently formed. The gate spacer 42 contacts sidewalls of each of the first high-k dielectric 54, the band-gap-disrupting dielectric 56, and the second high-k dielectric 58. Each of the first high-k gate dielectric 54, the band-gap-disrupting dielectric 56, and the second high-k gate dielectric 56 needs to be kept free of diffusion across the first and second atomic interfaces can be effected by maintaining the stratified gate dielectric stack 50 under a temperature that induces detectable interdiffusion of materials across the first atomic interface or the second atomic interface at least until at least said field effect transistor is incorporated into a functional semiconductor chip. It is noted that currently known gate-first processing schemes are not compatible with the requirement that the temperature of the gate stack be kept below 800 degrees Celsius because activation of dopants in the source and drain regions after ion implantation that provides dopants into the source and drain regions require an anneal at a temperature of at least 900 degrees Celsius. It is contemplated herein, however, that if, and only if, the temperature of the third exemplary semiconductor structure can be kept below a temperature above which inter-atomic diffusion occurs at a detectable level across the first atomic interface or across the second atomic interface at least until at least the field effect transistor is incorporated into a functional semiconductor chip, the third semiconductor structure can be provided as an operational device having a stratified gate dielectric stack 50 as described above.

Figure 14A:
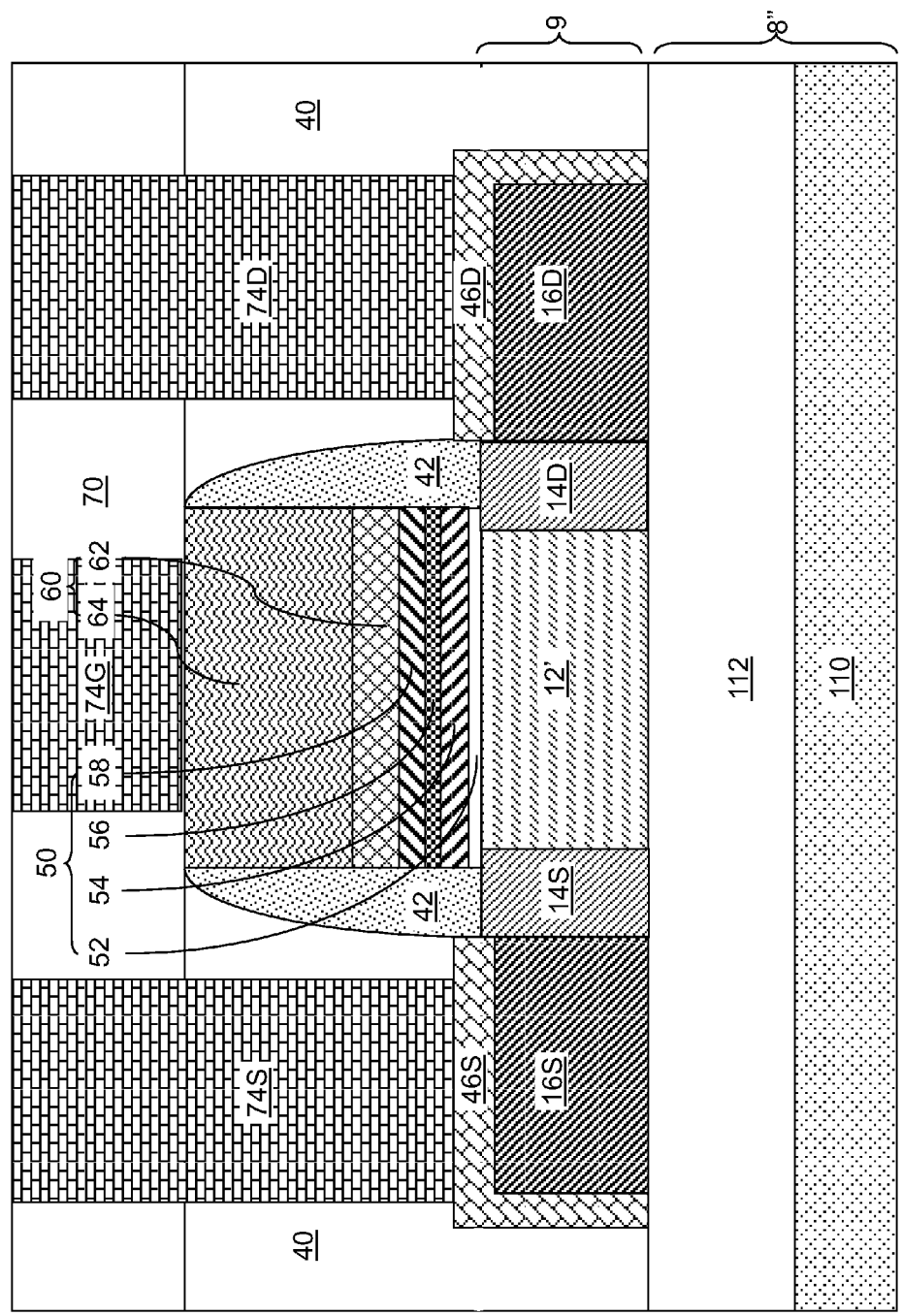
FIG. 14A is a vertical cross-sectional view of a variation of the third exemplary semiconductor structure including a finFET having a gate dielectric including a stratified gate dielectric stack formed by a gate-first integration scheme that does not employ a disposable gate structure according to the third embodiment of the present disclosure.

Referring to FIG. 14A, a variation of the third exemplary semiconductor structure including a finFET having a gate dielectric 50 including a stratified gate dielectric stack is shown according to a second embodiment of the present disclosure. A semiconductor-on-insulator (SOI) substrate including a handle substrate 110, a buried insulator layer 112, and a top semiconductor layer can be employed to form a semiconductor fin 9 on a substrate 8' including the stack of the handle substrate 110 and the buried insulator layer 112.

After formation of an interfacial dielectric layer on physically exposed surfaces of the semiconductor fin 9, each of the first high-k gate dielectric layer 54L, the band-gap-disrupting dielectric layer 56L, the second high-k gate dielectric layer 58L, the work function material layer 62L, and the conductive material layer 64L, the work function material layer, and the conductive material layer 64L is deposited over the semiconductor fin 9 and the buried insulating layer 112 below a temperature above which inter-atomic diffusion occurs at a detectable level across the first atomic interface or across the second atomic interface. Disposable gate level layers (23L, 27L, 29L) illustrated in FIG. 1 are not formed in this gate first integration scheme. The temperature above which the inter-atomic diffusion occurs across the first atomic interface or across the second atomic interface is less than 800 degrees Celsius, and is typically in a range between 700 degrees Celsius and 800 degrees Celsius.

Each of the first high-k dielectric layer 54L, the band-gap-disrupting dielectric layer 56L, and the second high-k dielectric layer 58L is deposited as a continuous layer that extends over an entirety of the substrate 8'. The stack of the interfacial dielectric layer, the first high-k gate dielectric layer 54L, the band-gap-disrupting dielectric layer 56L, the second high-k gate dielectric layer 58L, the work function material layer 62L, and the conductive material layer 64L, the work function material layer, and the conductive material layer 64L is lithographically patterned to form the stratified gate dielectric stack 50 and the gate electrode 60 that straddle over a middle portion of the semiconductor fin 9. The gate spacer 42 and the planarization dielectric layer 40 are subsequently formed. The gate spacer 42 contacts sidewalls of each of the first high-k dielectric 54, the band-gap-disrupting dielectric 56, and the second high-k dielectric 58. Each of the first high-k gate dielectric 54, the band-gap-disrupting dielectric 56, and the second high-k gate dielectric 56 needs to be kept free of diffusion across the first and second atomic interfaces can be effected by maintaining the stratified gate dielectric stack 50 under a temperature that induces detectable interdiffusion of materials across the first atomic interface or the second atomic interface at least until at least said field effect transistor is incorporated into a functional semiconductor chip. As noted above, currently known gate-first processing schemes are not compatible with the requirement that the temperature of the gate stack be kept below 800 degrees Celsius because activation of dopants in the source and drain regions after ion implantation that provides dopants into the source and drain regions require an anneal at a temperature of at least 900 degrees Celsius. It is contemplated herein, however, that if, and only if, the temperature of the variation of the third exemplary semiconductor structure can be kept below a temperature above which inter-atomic diffusion occurs at a detectable level across the first atomic interface or across the second atomic interface at least until at least the field effect transistor is incorporated into a functional semiconductor chip, the variation of the third semiconductor structure can be provided as an operational device having a stratified gate dielectric stack 50 as described above.

While the disclosure has been described in terms of specific embodiments, it is evident in view of the foregoing description that numerous alternatives, modifications and variations will be apparent to those skilled in the art. Various embodiments of the present disclosure can be employed either alone or in combination with any other embodiment, unless expressly stated otherwise or otherwise clearly incompatible among one another. Accordingly, the disclosure is intended to encompass all such alternatives, modifications and variations which fall within the scope and spirit of the disclosure and the following claims.

What is claimed is:

1. A method of forming a semiconductor structure including a field effect transistor (FET), said method comprising:
   providing a gate cavity laterally surrounded by a planarization dielectric layer on a semiconductor substrate;
   forming a first high dielectric constant (high-k) gate dielectric layer comprising a first high-k dielectric material in said gate cavity and on a portion of said semiconductor substrate, wherein said first high-k gate dielectric layer has a horizontal portion located on said portion of said semiconductor substrate and vertical portions extending upward from said horizontal portion;

forming a band-gap-disrupting dielectric layer comprising a dielectric material having a different band gap than said first high-k gate dielectric material directly on said horizontal portion of said first high-k gate dielectric layer;

forming a second high-k gate dielectric layer comprising a second high-k dielectric material having a different band gap than said band-gap-disrupting dielectric of said band-gap-disrupting dielectric layer, wherein said second high-k gate dielectric layer has a horizontal portion located directly on a topmost surface of said band-gap-disrupting dielectric layer and vertical portions extending upward from said horizontal portion and in direct physical contact with vertical portions of said first high-k gate dielectric layer; and patterning a stack of said first high-k gate dielectric layer, said band-gap-disrupting dielectric layer, and said second high-k gate dielectric layer to form a stratified gate dielectric stack of a first high-k gate dielectric, a band-gap-disrupting dielectric, and a second high-k gate dielectric, wherein a first atomic interface between said band-gap-disrupting dielectric and said first high-k gate dielectric is spaced from a second atomic interface between said band-gap-disrupting dielectric and said second high-k gate dielectric by at least one continuous atomic layer of said dielectric material of said band-gap-disrupting dielectric within said stratified gate dielectric stack and wherein said topmost surface of said band-gap-disrupting dielectric is located beneath a topmost surface of said vertical portions of said first and second high-k gate dielectrics.

2. The method of claim 1, wherein said forming of said stratified gate dielectric stack comprises preserving said first high-k dielectric material to be substantially free of said dielectric material of said band-gap-disrupting dielectric until, and during, said patterning of said stack.

3. The method of claim 2, wherein said forming of said stratified gate dielectric stack further comprises preserving said second high-k dielectric material to be substantially free of said dielectric material of said band-gap-disrupting dielectric until, and during, said patterning of said stack.

4. The method of claim 3, wherein said forming of said stratified gate dielectric stack further comprises preserving said dielectric material of said band-gap-disrupting dielectric to be substantially free of said first high-k dielectric material and said second high-k dielectric material until, and during, said patterning of said stack.

5. The method of claim 1, wherein said forming of said second high-k gate dielectric layer comprises depositing a same material as said first high-k dielectric material as said second high-k dielectric material.

6. The method of claim 1, wherein said forming of said second high-k gate dielectric layer comprises depositing a material having a different composition from a composition of said first high-k dielectric material and selected from $HfO_2$, $ZrO_2$, $HfO_pN_q$, $ZrO_pN_q$, and alloys thereof, wherein each value of p is independently from 0.5 to 3 and each value of q is independently from 0 to 2.

7. The method of claim 1, further comprising:
forming a disposable gate structure on said semiconductor substrate prior to forming said planarization dielectric layer; and planarizing said planarization dielectric layer, wherein a topmost surface of said disposable gate structure is coplanar with a top surface of said planarization dielectric layer after said planarizing, and said gate cavity is formed by removing said disposable gate structure after said planarizing of said planarization dielectric layer.

8. The method of claim 1, wherein said patterning of said stack of said first high-k gate dielectric layer, said band-gap-disrupting dielectric layer, and said second high-k gate dielectric layer comprises removing portions of said first high-k gate dielectric layer, said band-gap-disrupting dielectric layer, and said second high-k gate dielectric layer from above a top surface of said planarization dielectric layer.

9. The method of claim 1, further comprising:
forming a work function material layer on said second high-k dielectric layer and within said gate cavity;
forming a conductive material layer on said work function material layer and within said gate cavity; and
removing portions of said work function material layer and said conductive material layer from above a planarized surface of said planarization dielectric layer.

10. The method of claim 1, further comprising forming a gate spacer on sidewalls of said disposable gate structure, wherein said first high-k gate dielectric layer is deposited directly on inner sidewalls of said gate spacer.

11. The method of claim 1, further comprising maintaining said stratified gate dielectric stack under a temperature that induces detectable interdiffusion of materials across said first atomic interface or said second atomic interface at least until at least said field effect transistor is incorporated into a functional semiconductor chip.

12. The method of claim 1, wherein said band-gap-disrupting dielectric layer is formed by a non-conformal deposition method that forms said band-gap-disrupting dielectric layer as at least two disjoined portions including an upper portion overlying a planarization dielectric layer and a lower portion located underneath a top surface of said planarization dielectric layer.

13. The method of claim 1, further comprising forming an interfacial dielectric by converting a surface portion of a semiconductor material of said semiconductor substrate into a dielectric material comprising said semiconductor material and at least one of oxygen and nitrogen.

14. The method of claim 1, wherein said semiconductor substrate is a bulk semiconductor substrate and said field effect transistor is a planar field effect transistor.

15. The method of claim 1, wherein said semiconductor substrate is a semiconductor-on-insulator substrate and said field effect transistor is a planar field effect transistor.

* * * * *